(12) United States Patent
Coppa et al.

(10) Patent No.: US 10,446,453 B2
(45) Date of Patent: Oct. 15, 2019

(54) SURFACE MODIFICATION CONTROL FOR ETCH METRIC ENHANCEMENT

(71) Applicant: Tokyo Electron Limited, Tokyo (JP)

(72) Inventors: Brian J. Coppa, Boise, ID (US);
Viswas Purohit, Boise, ID (US);
Seiichi Watanabe, Taiwa-cho (JP);
Kenji Komatsu, Boise, ID (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/920,295

(22) Filed: Mar. 13, 2018

(65) Prior Publication Data
US 2018/0269119 A1  Sep. 20, 2018

Related U.S. Application Data

(60) Provisional application No. 62/473,193, filed on Mar. 17, 2017.

(51) Int. Cl.
*H01L 21/66* (2006.01)
*H01L 21/311* (2006.01)
(Continued)

(52) U.S. Cl.
CPC ........ *H01L 22/26* (2013.01); *H01J 37/32935* (2013.01); *H01J 37/32972* (2013.01);
(Continued)

(58) Field of Classification Search
CPC .............. H01L 22/26; H01L 21/31116; H01J 37/32935; H01J 37/32972; G03F 7/2024; G03F 7/40
See application file for complete search history.

(56) References Cited

U.S. PATENT DOCUMENTS 3,059,611 A  10/1962 Fury
3,612,692 A  10/1971 Kruppa et al.
(Continued)

FOREIGN PATENT DOCUMENTS

CN  101038860 A  9/2007
CN  101221891 A  7/2008
(Continued)

OTHER PUBLICATIONS

International Preliminary Report on Patentability dated Oct. 11, 2018 in International Application No. PCT/US2017/024138, filed Mar. 24, 2017,15 pp.
(Continued)

*Primary Examiner* — Anita K Alanko
(74) *Attorney, Agent, or Firm* — Oblon, McClelland, Maier & Neustadt, L.L.P.

(57) ABSTRACT

A method is disclosed for monitoring and controlling a process of plasma-assisted surface modification of a layer formed on a substrate. The method includes flowing a surface modification gas into a plasma processing chamber of a plasma processing system, igniting a plasma in the plasma processing chamber to initiate a surface modification process for a layer formed on a substrate, and acquiring optical emission spectra from an optical emission spectroscopy system attached to the plasma processing chamber, during the surface modification process for the layer. For one embodiment, the method includes altering at least one parameter of the surface modification process based on the acquired optical emission spectra. For one embodiment, the acquired optical emission spectra can include an intensity of a spectral line, a slope of a spectral line, or both to enable endpoint control of the surface modification process. Additional methods and related systems are also disclosed.

35 Claims, 16 Drawing Sheets

(51) Int. Cl.
  *H01J 37/32* (2006.01)
  *H01L 21/027* (2006.01)
  *G03F 7/20* (2006.01)
  *G03F 7/40* (2006.01)
(52) U.S. Cl.
  CPC .... *H01L 21/0273* (2013.01); *H01L 21/31116* (2013.01); *H01L 21/31144* (2013.01); *G03F 7/2024* (2013.01); *G03F 7/40* (2013.01)

(56) References Cited

U.S. PATENT DOCUMENTS

| | | |
|---|---|---|
| 4,147,435 A | 4/1979 | Habegger |
| 5,014,217 A | 5/1991 | Savage |
| 5,308,414 A | 5/1994 | O'Neill et al. |
| 5,347,460 A | 9/1994 | Gifford et al. |
| 5,353,790 A | 10/1994 | Jacques et al. |
| 5,450,205 A | 9/1995 | Sawn et al. |
| 5,648,198 A | 7/1997 | Shibata |
| 5,751,416 A | 5/1998 | Singh et al. |
| 5,885,472 A | 3/1999 | Miyazaki et al. |
| 5,980,767 A | 11/1999 | Koshimizu et al. |
| 6,060,328 A | 5/2000 | En et al. |
| 6,081,334 A | 6/2000 | Grimbergen et al. |
| 6,090,302 A | 7/2000 | Smith, Jr. et al. |
| 6,132,577 A | 10/2000 | Smith, Jr. et al. |
| 6,374,832 B2 | 4/2002 | Chow et al. |
| 6,381,008 B1 | 4/2002 | Branagh et al. |
| 6,535,779 B1 | 3/2003 | Birang et al. |
| 6,564,114 B1 | 5/2003 | Toprac et al. |
| 6,582,618 B1 | 6/2003 | Toprac et al. |
| 6,703,250 B2 * | 3/2004 | Chiu ............... H01J 37/32935 216/58 |
| 6,745,095 B1 | 6/2004 | Ben-Dov et al. |
| 6,815,653 B2 | 11/2004 | Tsay et al. |
| 6,825,920 B2 | 11/2004 | Lam et al. |
| 6,830,939 B2 | 12/2004 | Harvey et al. |
| 6,911,157 B2 | 6/2005 | Edamura et al. |
| 6,958,484 B2 | 10/2005 | Mitrovic |
| 7,241,397 B2 | 7/2007 | Fink et al. |
| 7,312,865 B2 | 12/2007 | Chen |
| 7,328,126 B2 | 2/2008 | Chamness |
| 7,334,477 B1 | 2/2008 | Pirkle |
| 7,591,923 B2 | 9/2009 | Mitrovic et al. |
| 7,906,032 B2 | 3/2011 | Yamashita |
| 7,959,970 B2 | 6/2011 | Gaudet et al. |
| 8,048,326 B2 | 11/2011 | Yue et al. |
| 8,154,721 B2 | 4/2012 | Chen et al. |
| 8,158,017 B2 | 4/2012 | Hudson |
| 8,173,451 B1 | 5/2012 | Tian et al. |
| 8,415,884 B2 | 4/2013 | Chen et al. |
| 8,416,509 B2 | 4/2013 | Yi et al. |
| 8,513,583 B2 | 8/2013 | Corke et al. |
| 8,553,218 B2 | 10/2013 | Tinnemans et al. |
| 8,877,080 B2 | 11/2014 | Chen et al. |
| 9,200,950 B2 | 12/2015 | Lian et al. |
| 9,760,008 B2 * | 9/2017 | deVilliers ............. G03F 7/2024 |
| 9,842,726 B2 | 12/2017 | Daniels et al. |
| 2002/0029851 A1 | 3/2002 | Edamura et al. |
| 2003/0132195 A1 | 7/2003 | Edamura et al. |
| 2004/0008336 A1 | 1/2004 | Lam et al. |
| 2004/0058359 A1 | 3/2004 | Mei et al. |
| 2004/0104681 A1 | 6/2004 | Mitrovic |
| 2004/0235303 A1 | 11/2004 | Wong et al. |
| 2005/0241669 A1 | 11/2005 | Wodecki |
| 2006/0006139 A1 | 1/2006 | Johnson et al. |
| 2007/0128876 A1 | 6/2007 | Fukiage |
| 2008/0186473 A1 | 8/2008 | Lee |
| 2009/0065025 A1 | 3/2009 | Urbanowicz et al. |
| 2009/0280581 A1 | 11/2009 | Hudson |
| 2009/0325387 A1 | 12/2009 | Chen et al. |
| 2010/0081285 A1 * | 4/2010 | Chen ..................... G03F 7/40 438/710 |
| 2011/0139748 A1 | 6/2011 | Donnelly et al. |
| 2011/0174776 A1 | 7/2011 | Kabe et al. |
| 2012/0006351 A1 | 1/2012 | Jun et al. |
| 2012/0085494 A1 | 4/2012 | Uchida et al. |
| 2012/0091097 A1 | 4/2012 | Chen et al. |
| 2012/0175060 A1 | 7/2012 | Hudson et al. |
| 2013/0016344 A1 | 1/2013 | Bullock et al. |
| 2013/0141720 A1 | 6/2013 | Park et al. |
| 2015/0241272 A1 | 8/2015 | Lian et al. |
| 2016/0268108 A1 | 9/2016 | Daniels et al. |

FOREIGN PATENT DOCUMENTS

| | | |
|---|---|---|
| CN | 102282654 A | 12/2011 |
| CN | 103117202 B | 9/2015 |
| EP | 0 652 415 A1 | 10/1994 |
| JP | 2005-527984 A | 9/2005 |
| JP | 2016-541119 A | 12/2016 |
| KR | 10-2012-0126418 A | 11/2012 |
| TW | 589659 B | 6/2004 |
| WO | 02/091453 A1 | 11/2002 |
| WO | 2005/111265 A1 | 11/2005 |
| WO | 2015/130433 A1 | 9/2015 |

OTHER PUBLICATIONS

International Search Report and Written Opinion dated Mar. 12, 2018 in PCT/US2017/062316, 13 pp.

International Search Report & Written Opinion dated Aug. 18, 2017 in International Application No. PCT/US2017/024138, filed Mar. 24, 2017 18 pp.

International Search Report & Written Opinion dated Jun. 29, 2018 in International Application No. PCT/US2018/022253, filed Mar. 13, 2018 13 pp.

De Schepper, P. et al., "Pattern Roughness Mitigation of 22 nm Lines and Spaces: The Impact of a H2 Plasma Treatment", Plasma Processes and Polymers, Sep. 2014, 10 pp. [retrieved on Jun. 7, 2016] <DOI: 10.1002/ppap.201400078>.

Yamaguchi, T. et al., "Direct current superposed dual-frequency capacitively coupled plasmas in selective etching of SiOCH over SiC", Journal of Physics D Applied Physics, Dec. 2011, 25 pp. [retrieved on May 6, 2016] <DOI: 10.1088/0022-3727/45/2/025203>.

Notification of Examination Opinions dated May 11, 2018 in Taiwanese Patent Application No. 106110455 (w/ English language translation) 12 pp.

Office Action dated Sep. 19, 2018 in U.S. Appl. No. 15/453,555.

Combined Chinese Office Action and Search Report dated Mar. 3, 2016 in Chinese Patent Application No. 201380054482.2 (with English translation), 12 pages.

Ventzek, P.L.G., et al., "Formation, Nature, and Stability of the Arsenic-Silicon-Oxygen Alloy for Plasma Doping of Non-Planar Silicon Structures", Applied Physics letters, vol. 105, 2014, pp. 262102-1-262102-5 with cover page.

Combined Taiwanese Office Action and Search Report dated May 25, 2015 in Taiwanese Patent Application No. 102137525 (with English translation), 19 pages.

White, D.a. "Multivariate Analysis of Spectral Measurements for the Characterization of Semiconductor Processes", Dissertation presented Apr. 2002, at Massachusetts Institute of Technology, pp. 1-357.

Goodlin, B.E., "Multivariate Endpoint Detection of Plasma Etching Processes", Dissertation presented Apr. 2002, at Massachusetts Institute of Technology, pp. 1-226.

International Search Report and Written Opinion dated Mar. 19, 2014 in PCT/US2013/065378, 22 pages.

Yue, H.H., et al., "Plasma Etching Endpoint Detection Using Multiple Wavelengths for Small Open-Area Wafers", J. Vac. Sci. Technol. A, vol. 19 No. 1, 2001, pp. 66-75 with cover page.

White, D., et al., "Low-Open Area Endpoint Detection using a PCA based $T^2$ Statistic and Q Statistic on Optical Emission Spectroscopy Measurements", IEEE Transactions on Semiconductor Manufacturing, vol. 13 No. 2, May 2000, pp. 1-30.

Goodlin, B. E., et al., "Quantitative Analysis and Comparison of Endpoint Detection Based on Multiple Wavelength Analysis", 201st

(56) References Cited

OTHER PUBLICATIONS

Meeting of the Electrochemical Society, International Symposium on Plasma Processing XIV, Abs. 415, May 2002, pp. 1-30.
Chinese Office Action dated Oct. 31, 2016 in Chinese Patent Application No. 201380054482.2 (with English translation), 10 pages.
Japanese Office Action dated Jul. 5, 2016 in Japanese Patent Application No. 2015-537813 (with English translation), 4 pages.
Combined Taiwanese Office Action and Search Report dated Jan. 2, 2018 in Taiwanese Patent Application No. 105137371 (with English translation), 16 pages.
International Search Report and Witten Opinion dated Jan. 31, 2017 in PCT/US2016/062017, 13 pages.
Master's Thesis of Jae-Wook Lee, presented at University of California, Berkeley, Jul. 1, 2000, 69 pages.
Shannon, S., et al., "A Spatially Resolved Optical Emission Sensor Plasma Etch Monitoring", Appl. Phys. Lett., vol. 71 No. 11, Sep. 1997, pp. 1467-1468.
Selwyn, G.S., "Optical Diagnostic Techniques for Plasma Processing", AVS Press, 1993, Relevant chapter 3 on Optical Emission Spectroscopy (OES) is provided, pp. 26-80 with title and bibliographic information pages.
International Search Report and Written Opinion dated Jan. 29, 2015 in PCT/US2014/63565, 8 pages.

\* cited by examiner

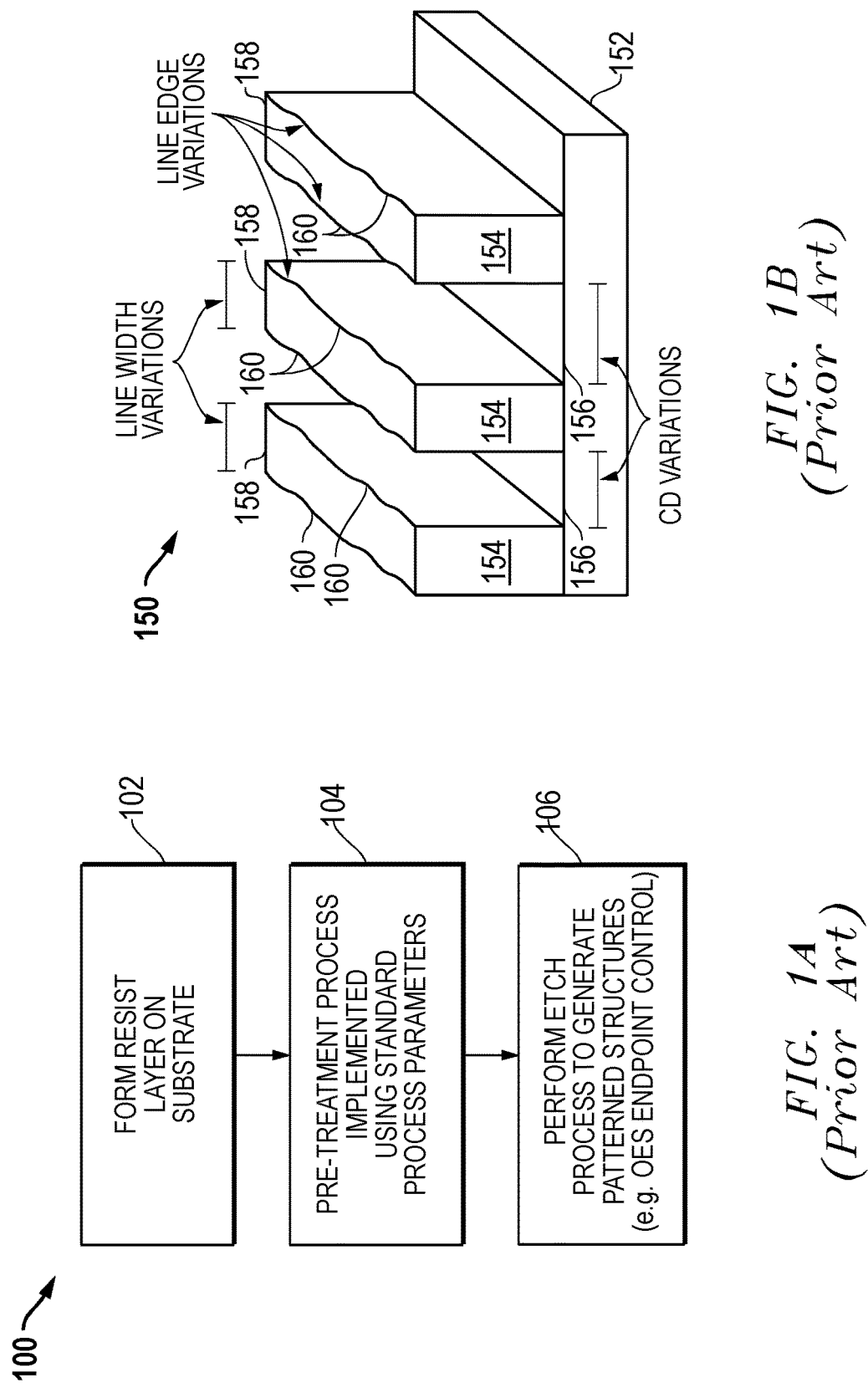

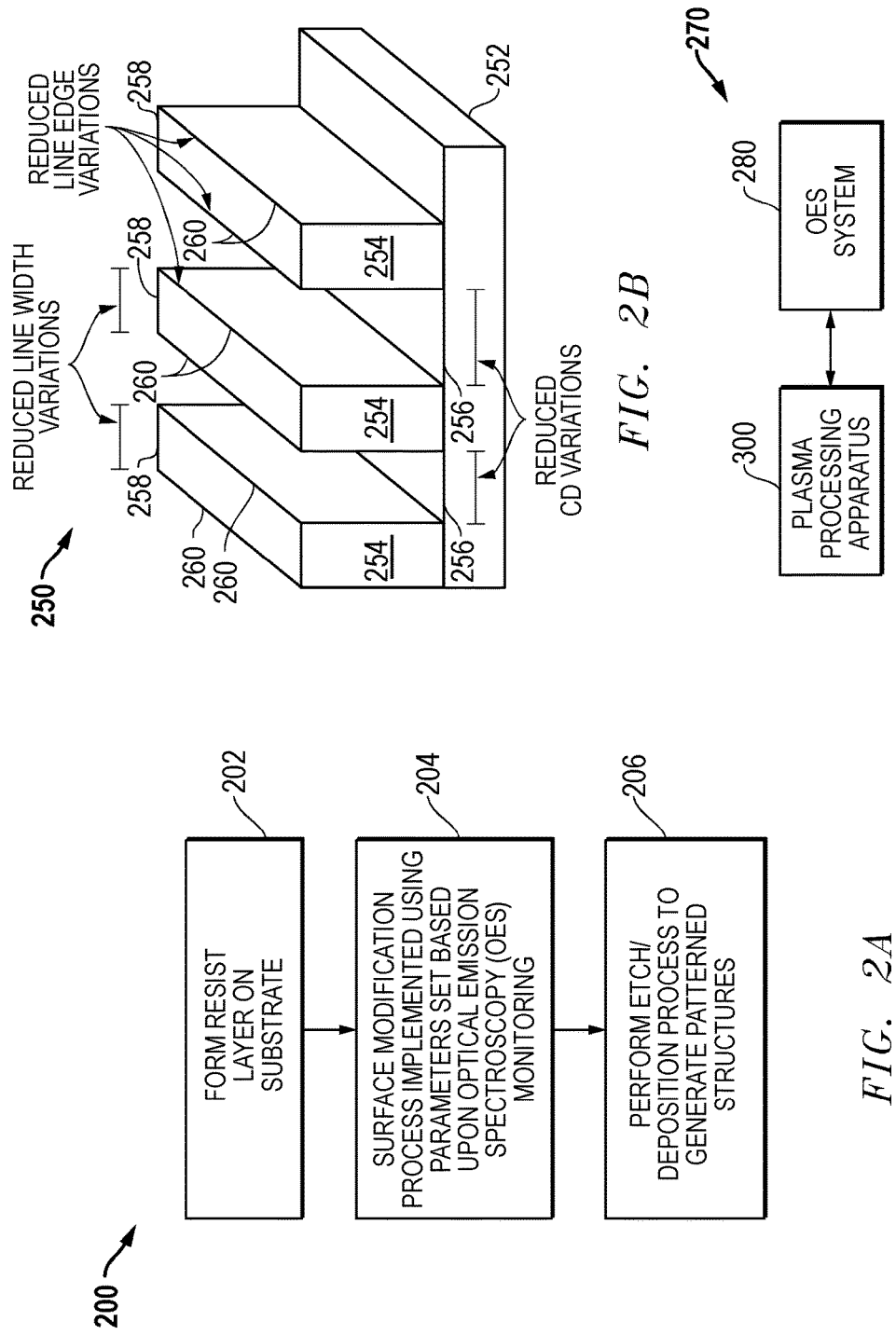

BEOL Trench POR with Resist Cure Pre-Etch Treatment Step

| Recipe/Comment | Step | Etch Time [sec] | Pressure [mT] | Power [W] HF | Power [W] LF | Upper Electrode [V] | H2 (sccm) | O2 (sccm) | N2 (sccm) | CHF3 (sccm) | CF4 (sccm) | Ar (sccm) | RDC C/E Gas Flow (%) | Temp (degC) C/E |
|---|---|---|---|---|---|---|---|---|---|---|---|---|---|---|
| A-1 (no electron beam cure modification of resist) | Resist Cure | 20 | 100 | 150 | 0 | 0 | 225 | | 450 | | | | 50 | 10/10 |
| | Hard mask | 25 | 75 | 750 | 0 | 150 | | 14 | | 50 | 150 | | 80 | 25/25 |
| | Carbon | 27 | 20 | 500 | 0 | 0 | | 200 | | | | 100 | 80 | 25/25 |
| | Oxide | 69 | 20 | 0 | 1200 | 0 | | | | 10 | 70 | 300 | 40 | 25/30 |
| | Ash | 20 | 100 | 700 | 0 | 0 | | 500 | | | | | 50 | 25/30 |

← 402

| Recipe/Comment | Step | Etch Time [sec] | Pressure [mT] | Power [W] HF | Power [W] LF | Upper Electrode [V] | H2 (sccm) | O2 (sccm) | N2 (sccm) | CHF3 (sccm) | CF4 (sccm) | Ar (sccm) | RDC C/E Gas Flow (%) | Temp (degC) C/E |
|---|---|---|---|---|---|---|---|---|---|---|---|---|---|---|
| A-2 (High Voltage electron beam cure modification of resist) | Resist Cure | 20 | 100 | 150 | 0 | 900 | 225 | | 450 | | | | 50 | 10/10 |
| | Hard mask | 25 | 75 | 750 | 0 | 150 | | 14 | | 50 | 150 | | 80 | 25/25 |
| | Carbon | 27 | 20 | 500 | 0 | 0 | | 200 | | | | 100 | 80 | 25/25 |
| | Oxide | 69 | 20 | 0 | 1200 | 0 | | | | 10 | 70 | 300 | 40 | 25/30 |
| | Ash | 20 | 100 | 700 | 0 | 0 | | 500 | | | | | 50 | 25/30 |

← 404

| Recipe/Comment | Step | Etch Time [sec] | Pressure [mT] | Power [W] HF | Power [W] LF | Upper Electrode [V] | H2 (sccm) | O2 (sccm) | N2 (sccm) | CHF3 (sccm) | CF4 (sccm) | Ar (sccm) | RDC C/E Gas Flow (%) | Temp (degC) C/E |
|---|---|---|---|---|---|---|---|---|---|---|---|---|---|---|
| A-4 (A-2 Base w/10s shorter resist cure time) | Resist Cure | 10 | 100 | 150 | 0 | 900 | 225 | | 450 | | | | 50 | 10/10 |
| | Hard mask | 25 | 75 | 750 | 0 | 150 | | 14 | | 50 | 150 | | 80 | 25/25 |
| | Carbon | 27 | 20 | 500 | 0 | 0 | | 200 | | | | 100 | 80 | 25/25 |
| | Oxide | 69 | 20 | 0 | 1200 | 0 | | | | 10 | 70 | 300 | 40 | 25/30 |
| | Ash | 20 | 100 | 700 | 0 | 0 | | 500 | | | | | 50 | 25/30 |

Follow-up Resist Cure Recipes w/A-04 Base — 408

| Recipe/Comment | Step | Etch Time [sec] | Pressure [mT] | Power [W] HF | Power [W] LF | Upper Electrode [V] | H2 (sccm) | O2 (sccm) | N2 (sccm) | CHF3 (sccm) | CF4 (sccm) | Ar (sccm) | RDC C/E Gas Flow (%) | Temp (degC) C/E |
|---|---|---|---|---|---|---|---|---|---|---|---|---|---|---|
| A-5 | Resist Cure | 5 | 100 | 150 | 0 | 900 | 225 |  | 450 |  |  |  | 50 | 12/12 |
|  | Hard mask | 25 | 75 | 750 | 0 | 150 |  | 14 |  | 50 | 150 |  | 80 | 25/25 |
|  | Carbon | 27 | 20 | 500 | 0 | 0 |  | 200 |  |  |  | 100 | 80 | 25/25 |
|  | Oxide | 69 | 20 | 0 | 1200 | 0 |  |  |  | 10 | 70 | 300 | 40 | 25/30 |
|  | Ash | 20 | 100 | 700 | 0 | 0 |  | 500 |  |  |  |  | 50 | 25/30 |

Cure time reduction to improve all the specs by lessening resist loss leading to higher LWR — 410

| Recipe/Comment | Step | Etch Time [sec] | Pressure [mT] | Power [W] HF | Power [W] LF | Upper Electrode [V] | H2 (sccm) | O2 (sccm) | N2 (sccm) | CHF3 (sccm) | CF4 (sccm) | Ar (sccm) | RDC C/E Gas Flow (%) | Temp (degC) C/E |
|---|---|---|---|---|---|---|---|---|---|---|---|---|---|---|
| A-6 | Resist Cure | 5 | 100 | 150 | 0 | 700 | 225 |  | 450 |  |  |  | 50 | 12/12 |
|  | Hard mask | 25 | 75 | 750 | 0 | 150 |  | 14 |  | 50 | 150 |  | 80 | 25/25 |
|  | Carbon | 27 | 20 | 500 | 0 | 0 |  | 200 |  |  |  | 100 | 80 | 25/25 |
|  | Oxide | 69 | 20 | 0 | 1200 | 0 |  |  |  | 10 | 70 | 300 | 40 | 25/30 |
|  | Ash | 20 | 100 | 700 | 0 | 0 |  | 500 |  |  |  |  | 50 | 25/30 |

*FIG. 4B*

| Recipe | Equation (best fit) | Slope | Bottom CD (nm) | LWR (nm) | SWA (deg.) | TDU (nm) |
|---|---|---|---|---|---|---|
| A-1 | 1.034-0.0036 t | -0.0036 (flat) | 46.1 | 5.5 | 87.5 | 10 |
| A-6 | 1.264+0.0015 t | +0.0015 (flat) | 45.7 | 3.9 | 86.4 | 9.4 |
| A-5 | 1.518+0.0251 t | +0.025 (increasing) | 46.4 | 3.5 | 85.7 | 8.7 |
| A-2 | 1.679+0.0391 t | +0.039 (increasing) | 49.4 | 8.4 | 84.0 | 15 |
| A-4 | 1.607+0.0411 t | +0.041 (increasing) | 48.0 | 6.5 | 85.0 | 22.2 |

| Recipe | Equation (best fit) | Slope | Bottom CD (nm) | LWR (nm) | SWA (deg.) | TDU (nm) |
|---|---|---|---|---|---|---|
| A-6 | 0.949-0.0084 t | -0.0084 (steep decrease) | 45.7 | 3.9 | 86.4 | 9.4 |
| A-1 | 1.011+0.0013 t | -0.0013 (slight decrease) | 46.1 | 5.5 | 87.5 | 10 |
| A-5 | 1.005+0.0254 t | +0.0025 (slight increasing) | 46.4 | 3.5 | 85.7 | 8.7 |
| A-4 | 0.931+0.0146 t | +0.015 (large increasing) | 48.0 | 6.5 | 85.0 | 22.2 |
| A-2 | 0.951+0.0154 t | +0.015 (large increasing) | 49.4 | 8.5 | 84.0 | 15 |

| Recipe | Step | Etch Time [sec] | Pressure [mT] | Power [W] HF | Power [W] LF | DCS [V] | H2 (sccm) | O2 (sccm) | N2 (sccm) | CHF3 (sccm) | CF4 (sccm) | Ar (sccm) | RDC C/E Gas Ratio | Temp C/E (degC) | OES Max Inten. CH_431 | OES Max Inten. F_751 | OES Max Inten. O_777 | OES Max Inten. CO_662 | OES Max Inten. SiF_440 | OES Max Inten. CN_387 |
|---|---|---|---|---|---|---|---|---|---|---|---|---|---|---|---|---|---|---|---|---|
| A-1 | Cure | 20 | 100 | 150 | 0 | 0 | 225 | | 450 | | | | 50 | 10/10 | 605 | 8480 | 4650 | 12350 | 663 | 3180 |
| A-2 | Cure | 20 | 100 | 150 | 0 | 900 | 225 | | 450 | | | | 50 | 10/10 | 1175 | 4100 | 2280 | 6200 | 713 | 6450 |
| A-4 | Cure | 10 | 100 | 150 | 0 | 900 | 225 | | 450 | | | | 50 | 10/10 | 1180 | 4320 | 2360 | 6250 | 714 | 6500 |
| A-5 | Cure | 5 | 100 | 150 | 0 | 900 | 225 | | 450 | | | | 50 | 12/12 | 1150 | 5030 | 2670 | 7460 | 737 | 6750 |
| A-6 | Cure | 5 | 100 | 150 | 0 | 700 | 225 | | 450 | | | | 50 | 12/12 | 895 | 5820 | 3125 | 8650 | 660 | 5325 |

FIG. 10

| Etch Feature | ACI Target | Fab A non-resist cure POR | Fab B non-resist cure POR | A-1 Recipe: Baseline CH OES Intensity | A-2 Recipe: Large CH OES intensity increase >2s as resist cure as resist shrinks, consumed, roughened | A-4 Recipe: Large CH OES intensity increase >2s as resist cure as resist shrinks, consumed, roughened | A-5 Recipe: Slight CH OES intensity increase >2s as resist cure as resist shrinks, consumed, roughened | A-6 Recipe: Constant OES C-H intensity >2s associated with lack of resist loss/roughening |
|---|---|---|---|---|---|---|---|---|
| Pre-Etch Cure Condition | NA | No Cure | No Cure | 0V DCS, 20s H2/N2 exposure | 900V DCS, 20s H2/N2 e-beam cure | 900V DCS, 10s H2/N2 e-beam cure | 900V DCS, 5s H2/N2 e-beam cure | 700V DCS, 5s H2/N2 e-beam cure (New BKM) |
| Trench Depth (Scatter) | 180nm | 172.8 | 179.0 | 173 | 169 | 172 | 185 | 183 |
| TDU (Scatter) | 2nm (3σ) | 19.6 | 24.2 | 10 | 15 | 22.2 | 8.7 | 9.4 |
| Sidewall Angle (Scatter) | 85-88° | 87.8 | 88.1 | 87.5 | 84.0 | 85.0 | 85.7 | 86.4 |
| Bow (X-SEM) | 2nm | 2.3 | 2.3 | 2.2 | 3.0 | 2.5 | 2.0 | 1.5 |
| Bottom CD (CD-SEM) | 45nm | 44.9 | 46.6 | 46.1 | 49.4 | 48.0 | 46.2 | 45.7 |
| LWR (CD-SEM) | <5nm | 5.6 | 5.0 | 5.5 | 8.4 | 6.5 | 3.5 | 3.9 |
| CDU (CD-SEM) | 3nm (3σ) | 2.5 | 2.1 | 2.1 | 2.1 | 1.5 | 2.5 | 2.4 |

FIG. 11

SURFACE MODIFICATION CONTROL FOR ETCH METRIC ENHANCEMENT

RELATED APPLICATIONS

This application claims priority to the following co-pending provisional application: U.S. Provisional Patent Application Ser. No. 62/473,193, filed Mar. 17, 2017, and entitled "SURFACE MODIFICATION CONTROL FOR ETCH METRIC ENHANCEMENT," which is hereby incorporated by reference in its entirety.

BACKGROUND OF THE INVENTION

Optical emission spectroscopy (OES) spectra have been used for plasma dry etch processes to determine an etch endpoint. For example, when an etch process passes through a first material layer into a second material layer having different component materials, a sudden change in the OES spectral content can often be seen. This sudden change can be used as an etch endpoint indicator. Identifying a proper etch endpoint helps to control the amount of etching that occurs into stop layers during the etch process. However, even with more precise endpoint control, etch processes can still lead to undesirable variations in line width, line edges, and critical dimension (CD) of patterned features formed during the etch process. Example OES systems and methods are described in U.S. Pat. Nos. 5,980,767, 6,677,604, and U.S. Published Patent Application No. 2005/0173375, each of which is hereby incorporated by reference in its entirety.

FIG. 1A (Prior Art) is a flow diagram of an example embodiment 100 for a manufacturing process including an etch process, for example, that uses OES endpoint control. In block 102, a resist (e.g., photoresist) layer is formed on a substrate for a microelectronic workpiece, and the substrate can include one more previously formed layers and/or structures. In block 104, a pre-treatment process is applied to the resist layer using standard process parameters. The pre-treatment can include, for example, an electron beam (e-beam) resist surface modification pre-treatment utilizing the application of upper electrode DC superposition (DCS) voltage. In block 106, an etch process is performed to generate patterned structures, for example, using OES endpoint control. This etch process in part uses the resist layer to form the patterned structures. Example systems and methods that utilize DCS pre-treatment are described in U.S. Patent No. 2015/0160557, which is hereby incorporated by reference in its entirety.

FIG. 1B (Prior Art) is an example embodiment 150 for patterned structures including line structures 154 formed using the steps of FIG. 1A (Prior Art) on a substrate 152 for a microelectronic workpiece. The line structures 154 can include one or more layers. Variations within the line structures 154 can lead to subsequent problems with microelectronic devices formed with respect to the substrate 152. These variations include CD variations in the bottom surfaces 156 of trenches between the line structures 154, line width variations for the widths 158 of the line structures 154, and line edge variations for the edges 160 of the line structures 154. CD variations, line-width roughness (LWR), and line-edge roughness (LER) are parameters often used to evaluate the success of etch processes and/or other surface modification processes. Typically, it is desirable to reduce CD variations, LER, and LWR in patterned structures formed within substrates for microelectronic workpieces. Other etch metrics can also be monitored and/or measured with respect to etch processes.

SUMMARY OF THE INVENTION

A method is disclosed for monitoring and controlling a process of plasma-assisted surface modification of a layer formed on a substrate. The method includes flowing a surface modification gas into a plasma processing chamber of a plasma processing system, igniting a plasma in the plasma processing chamber to initiate a surface modification process for a layer formed on a substrate, and acquiring optical emission spectra from an optical emission spectroscopy system attached to the plasma processing chamber, during the surface modification process for the layer. For one embodiment, the method also includes altering at least one parameter of the surface modification process based on the acquired optical emission spectra. For one embodiment, the acquired optical emission spectra can include an intensity of a spectral line, a slope of a spectral line, or both. Additional methods and related systems are also disclosed.

As described herein, optical emission spectroscopy (OES) spectra of a photoresist (e.g. resist) surface modification step, which could be applied at various points during an integrated etch sequence, was correlated to post-etch metrics to form and systematically control subsequent wafer-to-wafer etch uniformity to determine feasibility and application of OES endpoint control. This concept is generic enough to apply to a wide range of plasma-based dry etch or deposition processes having a resist pre-treatment surface modification or hardening step, or even a de-scum step for residue removal prior to initiating dry etching of a hard-mask. Additionally, the process is applicable to surface modification processes for layers made of other materials, such as, for example, nanocrystalline hard-masks and dielectrics applied by spin-on and thin-film deposition processes.

As described further and summarized below, the concept was demonstrated on an etch chamber using back-end-of-line (BEOL) trench wafers to successfully create a new best known method (BKM) to be implemented into production. Thus, this approach leverages hardware capabilities of controllably applying an electron beam (e-beam) resist surface modification pre-treatment utilizing the application of upper electrode DC superposition voltage (i.e., DCS voltage) for generating a bias with respect to the plasma to achieve the desired etch metrics. Photoresist is often composed primarily of C—H molecules and electron beam exposure combined with reactive gas exposure induces CH crosslinking, which hardens the material leading to a higher etch resistance, as the CH bonding density is increased at the surface. Furthermore, UES endpoint resist surface modification control in-situ, especially including the tracking of CH gas intensity, could be applied to CD trim and advanced patterning methods versus the industry standard of post-etch metric-resist property change correlations, ex-situ, that are less direct and more time-consuming to improve the desired etch metrics. Other variations can also be implemented while still taking advantage of the techniques described herein.

A variety of embodiments can be implemented and different features and variations can be employed.

For one embodiment, a method is disclosed for monitoring and controlling a process of plasma-assisted surface modification of a layer formed on a substrate, and the method includes flowing a surface modification gas into a plasma processing chamber of a plasma processing system, igniting a plasma in the plasma processing chamber to initiate a surface modification process for a layer formed on a substrate, and acquiring optical emission spectra from an optical emission spectroscopy system attached to the plasma processing chamber, during the surface modification process for the layer.

In an additional embodiment, the plasma processing system is a plasma etching system, and the surface modification process occurs before or after one or more etch processes. In a further embodiment, the plasma processing system is a plasma system with deposition and/or etch capability, and the modification process occurs before or after one or more etch or deposition processes.

In an additional embodiment, data from the acquired optical emission spectra is used to determine an endpoint of the surface modification process. In a further embodiment, the method also includes stopping the surface modification process at a determined endpoint time based on the optical emission spectra. One example of an endpoint would be the leveling in intensity of a representative wavelength after the initial spike in the spectra, collectively associated with the surface modification process.

In an additional embodiment, data from the acquired optical emission spectra includes an intensity of a spectral line, a slope of a spectral line, or both. In a further embodiment, the spectral line is a spectral line corresponding to a chemical element or compound selected from a group consisting of N, Ar, Br, CH, C, CN, O, SiF, SiN, CO, Ti, Zr and F. In another further embodiment, the spectral line is a spectral line corresponding to a chemical element or compound including one or more of N, Ar, Br, CH, C, CN, O, SiF, SiN, CO, Ti, Zr and F.

In an additional embodiment, the method also includes altering at least one parameter of the surface modification process based on the acquired optical emission spectra. In a further embodiment, the at least one parameter of the surface modification process is selected from a group consisting of RF or microwave power supplied to a plasma processing chamber, RF or microwave power pulse frequency, RF or microwave pulse duty cycle, substrate temperature, RF power supplied to a substrate holder in the plasma processing chamber, DC bias of the substrate holder, DC bias voltage supplied to at least one electrode arranged proximate the substrate holder, gas flow rate, gas pressure, surface modification gas flow, surface modification gas pressure, and duration of the surface modification process. In another further embodiment, the at least one parameter of the surface modification process includes one or more of RF or microwave power supplied to a plasma processing chamber, RF or microwave power pulse frequency, RF or microwave pulse duty cycle, substrate temperature, RF power supplied to a substrate holder in the plasma processing chamber, DC bias of the substrate holder, DC bias voltage supplied to at least one electrode arranged proximate the substrate holder, gas flow rate, gas pressure, surface modification gas flow, surface modification gas pressure, and duration of the surface modification process.

In a still further embodiment, the altering of the at least one parameter of the surface modification process is performed to minimize a duration of the surface modification process. In another embodiment, the altering of the at least one parameter of the surface modification process is performed to improve a physical property or a geometrical characteristic or both of a pattern formed during a plasma etch or deposition process subsequent to the surface modification process. In a further embodiment, the physical property includes at least one of density or wet etch resistance, and the geometrical characteristic includes at least one of line width roughness (LWR) or line-edge roughness (LER).

In an additional embodiment, the altering of the at least one parameter of the surface modification process is performed to maximize a uniformity metric of a pattern formed during an etch or deposition process subsequent to the surface modification process. In a further embodiment, the uniformity metric is selected from a group consisting of critical dimension (CD) uniformity, sidewall angle (SWA) uniformity, and trench depth uniformity (TDU). In another further embodiment, the uniformity metric includes one or more of critical dimension (CD) uniformity, sidewall angle (SWA) uniformity, and trench depth uniformity (TDU).

In an additional embodiment, the altering of the at least one parameter of the surface modification process is performed to maximize a uniformity metric of a pattern formed during an etch process of a subsequently processed production substrate or a subsequently processed lot of production substrates.

In an additional embodiment, the altering of the at least one parameter of the surface modification process is performed to alter a physical, geometrical, electrical, chemical, or mechanical property of a material exposed to a surface modification process. In further embodiments, the property is selected from a group consisting of etch width critical dimension (CD), bow, tilting, twisting, etch selectivity, sidewall angle (SWA), etch depth, surface coverage, step coverage, layer thickness, layer density, layer composition, layer smoothness, and layer hardness. In another further embodiment, the property includes one or more of etch width critical dimension (CD), bow, tilting, twisting, etch selectivity, sidewall angle (SWA), etch depth, surface coverage, step coverage, layer thickness, layer density, layer composition, layer smoothness, and layer hardness.

In an additional embodiment, the altering of the at least one parameter of the surface modification process is performed to alter a physical, geometrical, electrical, or mechanical property of a layer in a subsequently processed production substrate or a subsequently processed lot of production substrates. In a further embodiment, the altering of the at least one parameter of the surface modification process is performed in-situ.

In an additional embodiment, the surface modification gas includes hydrogen, hydrogen-bromide, nitrogen, carbon, chlorine, fluorine, sulfur, argon, helium, oxygen or a combination of two or more thereof. In a further embodiment, the layer formed on the substrate includes a material selected from a group consisting of photoresist, spin-on-dielectric material, atomic or chemical vapor deposited dielectric material, low-k dielectric material, hi-k dielectric material, conductive material or a combination of two or more thereof. In another further embodiment, the layer formed on the substrate includes a material comprising one or more of photoresist, spin-on-dielectric material, atomic or chemical vapor deposited dielectric material, low-k dielectric material, hi-k dielectric material, or a combination of two or more thereof.

In an additional embodiment, the layer formed on the substrate includes a chemically amplified resist (CAR), and the method also includes altering at least one parameter of the surface modification process based on the acquired optical emission spectra to reduce likelihood of pattern collapse for the CAR. In a further embodiment, the CAR comprises an ArF-based dry or immersion resist.

In an additional embodiment, the layer formed on the substrate comprises a resist utilized in conjunction with extreme ultra-violet (EUV) photolithography. In a further embodiment, the EUV resist includes a material selected from a group comprising a metallic hardmask (MHM) layer, a nanocrystalline metal oxide MHM layer, and a MHM stack including a combination of these layers. In another further embodiment, the EUV resist includes a material comprising one or more of a metallic hardmask (MHM) layer, a nanocrystalline metal oxide MHM layer, and a MHM stack including a combination of these layers.

In an additional embodiment, the surface modification process includes an electron beam exposure surface modification process. In a further embodiment, the electron beam exposure surface modification process includes applying a direct current (DC) superposition voltage to an electrode within the plasma processing chamber. In another further embodiment, the layer formed on the substrate includes a resist layer, and the electron beam exposure surface modification process facilities curing or hardening of the resist layer. In a still further embodiment, e-beam voltage is increased along with exposure time such that a bulk of the layer is modified for the layer.

In an additional embodiment, the surface modification process includes at least one of a surface hardening step, a curing of the layer formed on the substrate, or a de-scum step for residue removal.

For one embodiment, a non-transitory machine-accessible storage medium is disclosed having instructions stored thereon which cause a data processing system to perform a method for monitoring and controlling a surface modification process in a plasma processing tool, the method including flowing a surface modification gas into a plasma processing chamber of a plasma processing system, igniting a plasma in the plasma processing chamber to initiate a surface modification process for a layer formed on a substrate, and acquiring optical emission spectra from an optical emission spectroscopy system attached to the plasma processing chamber, during the surface modification process for the layer.

In an additional embodiment, the surface modification process includes an electron beam or ultraviolet light-based exposure surface modification process. In a further embodiment, the layer formed on the substrate includes a microelectronic device layer including at least one of a resist, liner, hard-mask, conductive, isolation or gap-fill material, and the like and wherein the electron beam exposure surface modification process facilities curing or hardening of the resist layer.

For one embodiments, a method is disclosed for monitoring and controlling a surface modification process in a plasma processing tool, the method including flowing a surface modification gas into a plasma processing chamber of a plasma processing system, igniting a plasma in the plasma processing chamber to initiate surface modification process for a layer formed on a substrate, and monitoring the plasma in the plasma processing chamber during the surface modification process using a monitoring system. For this method, the monitoring system includes at least one of an optical emission spectroscopy, a laser induced fluorescence, a laser interferometry, laser spectroscopy, a mass spectrometry, a Raman spectroscopy, a residual gas analyzer (RGA), or a Fourier Transform Infrared (FTIR) system.

In an additional embodiment, the surface modification process includes an electron beam exposure surface modification process. In further embodiments, the layer formed on the substrate includes a resist layer, and the electron beam exposure surface modification process facilities curing or hardening of the resist layer.

BRIEF DESCRIPTION OF THE DRAWINGS

A more complete understanding of the present inventions and advantages thereof may be acquired by referring to the following description taken in conjunction with the accompanying drawings, in which like reference numbers indicate like features, it is to be noted, however, that the accompanying drawings illustrate only exemplary embodiments of the disclosed concepts and are therefore not to be considered limiting of the scope, for the disclosed concepts may admit to other equally effective embodiments.

FIG. 1A (Prior Art) is a flow diagram of an example embodiment for a surface modification process including an etch process, for example, that uses optical emission spectroscopy (UES) endpoint control.

FIG. 1B (Prior Art) is an example embodiment for patterned structures including line structures formed using the steps of FIG. 1A (Prior Art) on a substrate for a microelectronic workpiece and related etch metrics.

FIG. 2A is a flow diagram of an example embodiment for a process including an etch process and/or a deposition process where OES monitoring is used during a surface modification process to improve metrics for patterned structures after subsequent etch/deposition processes.

FIG. 2B is an example embodiment for patterned structures including line structures formed using the steps of FIG. 2A on a substrate for a microelectronic workpiece and related metrics.

FIG. 2C is a block diagram of an example embodiment for a plasma processing system being monitored by an OES system.

FIGS. 4A-B provide example recipe embodiments for example back-end-of-line (BEOL) trench process modifications based upon a standard process of record (POR) where OES monitoring was used during a surface modification process.

bonded molecular compounds, detected at a wavelength of 440 nm, during the resist cure step conditions shown in FIGS. 4A-B.

Figure 7:
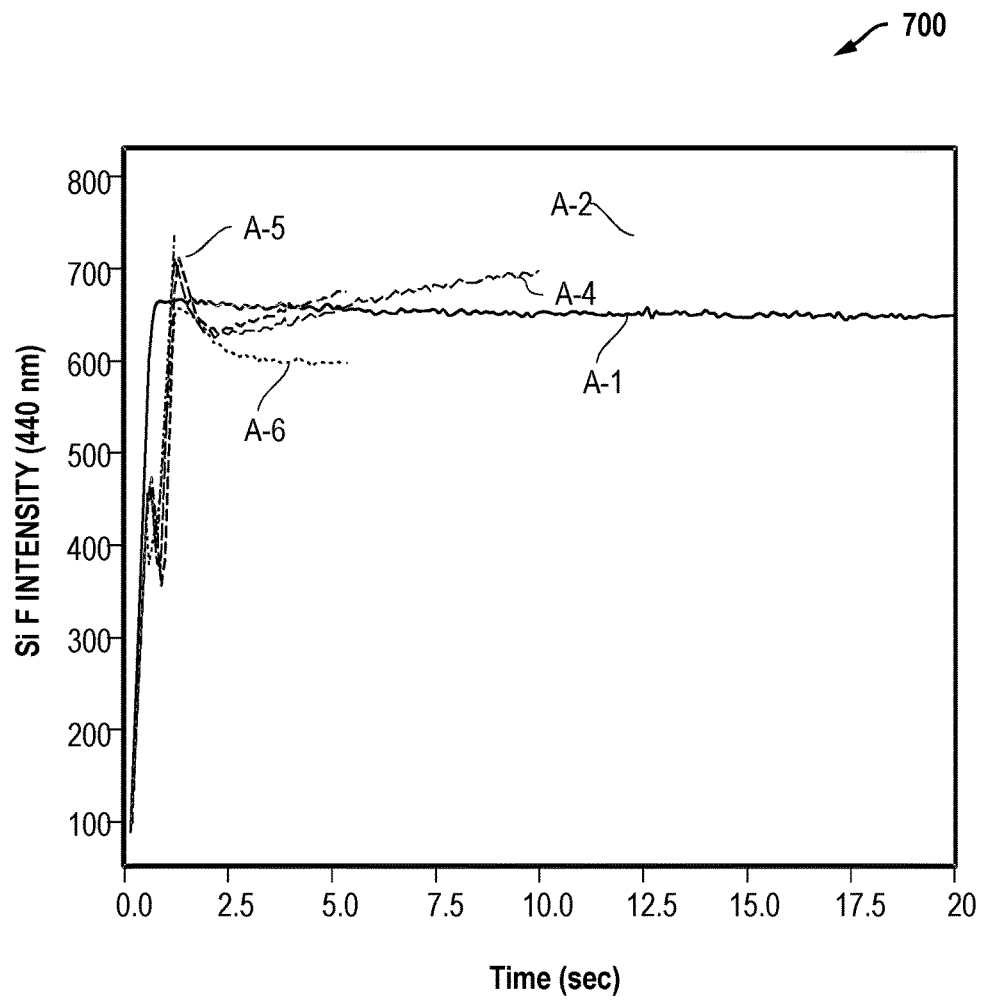
FIG. 7 is a plot for an example embodiment for OES spectral intensity levels measured for silicon-fluoride (SiF)
Figure 8:
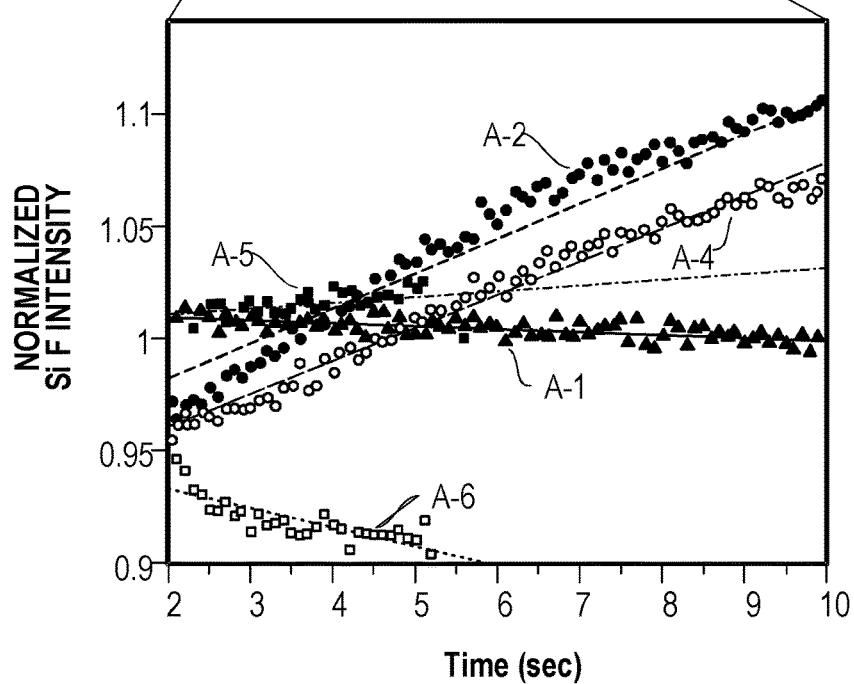

FIG. 8 is a diagram for an example embodiment for the slope of the normalized SiF OES peak spectral intensities after the 2 sec portion of specific resist cure step conditions associated with FIG. 7 compared to resulting etch metrics such as: bottom etch profile CI), LWR, SWA, and TDU.

FIGS. 9A-D provide diagrams for slopes of normalized SiF spectral intensities after the 2 sec portion of specific resist cure step conditions versus resulting etch metrics.

FIG. 10 provides an example table including a summary of OES maximum peak intensities versus resist cure conditions, indicating a lower maximum peak CH and CN intensity for the lower DCS voltage applied due to reduced e-beam penetration depth into the resist.

FIG. 11 provides a table including a summary for the resist cure parameters and associated etch metrics corresponding to the recipes described with respect to FIGS. 4A-B.

DETAILED DESCRIPTION OF THE INVENTION

A method is disclosed for monitoring and controlling a process of plasma-assisted surface modification of a layer formed on a substrate. The method includes flowing a surface modification gas into a plasma processing chamber of a plasma processing system, igniting a plasma in the plasma processing chamber to initiate a surface modification process for a layer formed on a substrate, and acquiring optical emission spectra from an optical emission spectroscopy system attached to the plasma processing chamber, during the surface modification process for the layer. For one embodiment, the method also includes altering at least one parameter of the surface modification process based on the acquired optical emission spectra. For one embodiment, the acquired optical emission spectra can include an intensity of a spectral line, a slope of a spectral line, or both. The surface modification process could comprise a high-density electron exposure or ultraviolet light-based treatment of one or more layers to be modified. Additional methods and related systems are also disclosed.

As described further below, photoresist pre-treatment optimization prior to dry etch of a trench feature in a semiconductor wafer using optical emission spectroscopy (OES) was carried out to improve key metrics resulting from a full etch process. The key metrics include, but not limited to, trench depth uniformity (TDU), line-width roughness (LWR), line-edge roughness (LER), profile bow, profile shape/side-wall angle (SWA), selectivity, and an etch profile width critical dimension (CD). OES was used as a diagnostic to monitor resist phase transformation, surface modification, compositional change, and the surface hardening effect, in-situ, during a dry etch pre-treatment step to determine an ideal or beneficial signature for specific wavelengths associated with one or more elements and/or compounds. Thus, it was found that OES monitoring and endpoint control could be applied to surface modification or pre-treatment processes for metric optimization with respect to etch/ deposition processes. Moreover, there is a narrow window of treatment parameters, which actually improve the surface smoothness and etch resistance of the resist, and an ideal cure condition is often not transferable to an alternative resist type or structural composition; thus, elevating the necessity of OES based optimization of resist cure conditions and ultimately endpoint control. The endpoint to be determined could be related to the slope or differential slope of particular wavelengths associated with the modification process. As a result, OES monitoring of the treatment process accelerates the learning process with real-time feedback to justify an ideal cure condition.

For one embodiment as described in more detail below, a pre-treatment step was added to an existing 20 second (s) trench process of record (POR) recipe having a resist surface modification/hardening step of only 5 s process time which improved line width roughness (LWR) by 30% and TDU uniformity by 52% over the POR without resist surface modification, while outperforming or essentially meeting all other etch pattern specifications. Reducing e-beam or DCS upper electrode voltage and resist surface modification time was implemented in a process recipe due to an OES signal response indicative that the resist surface modification effect was completed sooner (smoother modification layer formed) during the e-beam exposure surface modification step. Additional surface modification time led to resist loss and a rougher resist surface generating a wider CD and higher LWR, respectively. Clearly different and consistent OES responses were found for all wavelengths evaluated between recipes with a high degree of resist loss and roughness and/or LWR increase versus recipe conditions leading to lower LWR and less CD increase (resist loss), and these OES responses in turn led to resist smoothing that improved the etch profile metrics, desirable for microelectronic device applications. Nonetheless, it should be noted that higher e-beam voltage applied, generating higher electron beam energy, enables the electrons to penetrate deeper into the material to be modified. Thus, if the exposure time was elongated for keV beam energies, the whole bulk of the film would be modified, extending this technique beyond merely a surface treatment.

OES endpoint control can also be implemented to automate the resist surface modification/hardening modification step for ideal or improved resulting sidewall angle/profile, CD, LWR, and TDU. These ideal or improved metrics can be achieved while still preventing resist decomposition by over-exposure to the high voltage e-beam with N2/H2 shown by a distinctly different OES wavelength response (CH intensity level and slope). OES is typically only used for true etching steps that penetrate the hard-mask and subsequent under-layers. In contrast, the disclosed embodiments use OES for photoresist surface modification process control accelerate optimization and/or automate the e-beam exposure surface modification step to obtain a specific resist surface modification effect and more ideal resulting subsequent etch metrics thereafter. This concept also improves process throughput and ultimately wafer fab cycle time based on the definitive endpoint of a modification step. Moreover, it can be applied to any type of pre- or post-etch or deposition treatment surface modification step such as de-scum of photoresist or to alternative materials such as hard-masks, dielectrics for isolation purposes or the densification of diffusion barrier layers.

For additional embodiments, other techniques besides OES could be applied in stand-alone and/or a correlated fashion including: in-situ Fourier-transform infrared spectroscopy (FTIR), Raman spectroscopy (e.g., observing vibrational, rotational, and other low-frequency modes in a system); residual gas analyzer (RGA) spectrometry, and/or other spectroscopy techniques for cross-reference of evolving by-products during a material cure step. OES monitoring of subsequent etch steps following a cure can also be monitored as well to measure the effectiveness of the surface modification treatment with respect to resist etch resistance or selectivity correlated to specific resist etch by-products. OES monitoring of pre-treatment or post-treatment step by-products evolving from the wafer in other types of plasma-based chambers beyond dry etch, such as deposition systems including atomic layer deposition (ALD) and chemical vapor deposition (CVD) systems for patterning (e.g., ALD spacer formed on patterned photoresist for multi-patterning), can also be used to correlate spectra signatures with desired resulting post-process metrics. OES-based endpoints can also be applied once ideal or desired spectral features are identified.

For further embodiments, the OES monitoring techniques described herein can also provide numerous additional advantages. For example, the OES monitoring described herein can be used to provide automated UES controlled pre-treatment of resist cure processes and/or other pre- or post-treatment processes of other underlying materials on the substrate. OES monitoring of a cure treatment can also be used to eliminate pattern collapse of traditional chemically amplified resists (CAR) such as immersion or dry ArF based resist, especially in the case of extreme ultra-violet (EUV) photolithography.

For still further embodiments, the OES monitoring provided by the disclosed embodiments also enable lower cost, more conventional resists (e.g., ArF resists) to be used instead of higher cost metal-organic EUV resists in leading-edge device patterning. For example, metal oxide resists such as tin oxide, titanium oxide, zirconium oxide, and/or other metal oxide resists could be modified with this technique. In addition, the OES monitoring provided herein can widen the process window for photosensitivity and resolution versus line-edge roughness (LER) in photolithographic patterning during EN exposure, which is a typical tradeoff affecting manufacturability of this critical patterning method necessary to extend Moore's Law of integrated circuit (IC) scaling. This OES monitoring can also be used to reduce post development EUV resist roughness to reduce downstream pattern roughness and LWR or other key etch metrics to improve wafer yield.

Still further, the disclosed OES monitoring techniques can be used with respect to metallic hard-mask (MHM) layers deposited on a substrate, nanocrystalline metal oxide MI-IM layers spin-coated on a substrate, or a MHM stack including a combination of these layers, and/or other MHM layers and combinations of MHM layers. OES can be used to monitor the reflow of a nanocrystalline MHM in order to improve planarity of gap fill processes, especially in the case of keV range electron beams. Other variations and applications for OES monitoring during e-beam or ultraviolet light exposure for surface modification (e.g., resist cure or hardening) steps can also be implemented while still taking advantage of the embodiments described herein.

It is noted that OES systems and methods used with respect to etch processes and related chambers are described, for example, in U.S. Pat. Nos. 5,980,767, 6,677,604, and U.S. Published Patent Application No. 2005/0173375, each of which is hereby incorporated by reference in its entirety. These OES systems and methods as described therein and/or similar implementations can be used for the embodiments described herein that are relevant to OES monitoring to one or more pre-treatment or post-treatment processes with respect to one or more etch and or deposition processes.

Example OES monitoring embodiments according to the present inventions are described in more detail below with respect to the drawings. It is noted, however, that these embodiments are provided as examples and different and/or additional embodiments can be implemented, while still taking advantage of the techniques described herein, to apply OES monitoring to set parameters for pre-treatment and/or additional post-treatment processes with respect to etch and/or deposition process steps in order to improve etch metrics and/or deposition metrics associated with resulting patterned structures. In the case of a UV light based modification versus e-beam, the UV light source to be applied would ideally output wavelengths that would not interfere or overlap with critical peaks detected by the spectral light detector for accurately monitoring the pre- or post-treatment process.

FIG. 2A is a flow diagram of an example embodiment 200 for a manufacturing process including an etch process and/or a deposition chamber where OES monitoring is used during a surface modification process to improve metrics for patterned structures. Similar to prior solutions, a resist (e.g., photoresist) layer is formed on a substrate for a microelectronic workpiece in block 202, and the substrate can include one more previously formed layers and/or structures. In contrast with prior solutions, OES monitoring is used to set parameters for one or more pre-treatment or post-treatment surface modification processes that are applied to the resist layer in block 204. As with prior solutions, the surface modification can include, for example, an electron beam (e-beam) resist surface modification step (e.g., resist cure or hardening process step) utilizing the application of upper electrode DC superposition (DCS) voltage. In block 206, an etch process or deposition process is performed to generate patterned structures. As with prior solutions, this etch process can use OES endpoint control. This etch process in part uses the resist layer to form the patterned structures.

FIG. 2B is an example embodiment 250 for patterned structures including line structures 254 formed using the steps of FIG. 2A on a substrate 252 for a microelectronic workpiece. The line structures 254 can include one or more layers. Variations within the line structures 254 are reduced by applying OES monitoring to the pre-treatment process as described herein, and resulting microelectronic devices formed with respect to the substrate 252 are also improved. These reduced variations include reduced CD variations in the bottom surfaces 256 of trenches between the line structures 254, reduced line width variations for the widths 258 of the line structures 254, and reduced line edge variations for the edges 260 of the line structures 254. As indicated above, CD variations, line-width roughness (LWR), and line-edge roughness (LER) are parameters often used to evaluate the success of etch processes and/or other surface modification processes. These parameters are improved by the embodiments described herein, and different and/or additional pattern parameters can also be improved, such as trench depth uniformity (TDU), sidewall angle/profile, and/ or other metrics for patterned structures.

FIG. 2C is a block diagram of an example embodiment 270 for a plasma processing apparatus 300 being monitored by an OES system 280. The OES system 280 can be used to provide the OES monitoring described herein for surface modification processes. As further described herein, the OES system 280 monitors spectral energy within the process chamber for the plasma processing apparatus 300 during the surface modification process, and this monitoring can be used to adjust process parameters and/or control process operations (e.g., endpoint control).

Figure 2D:
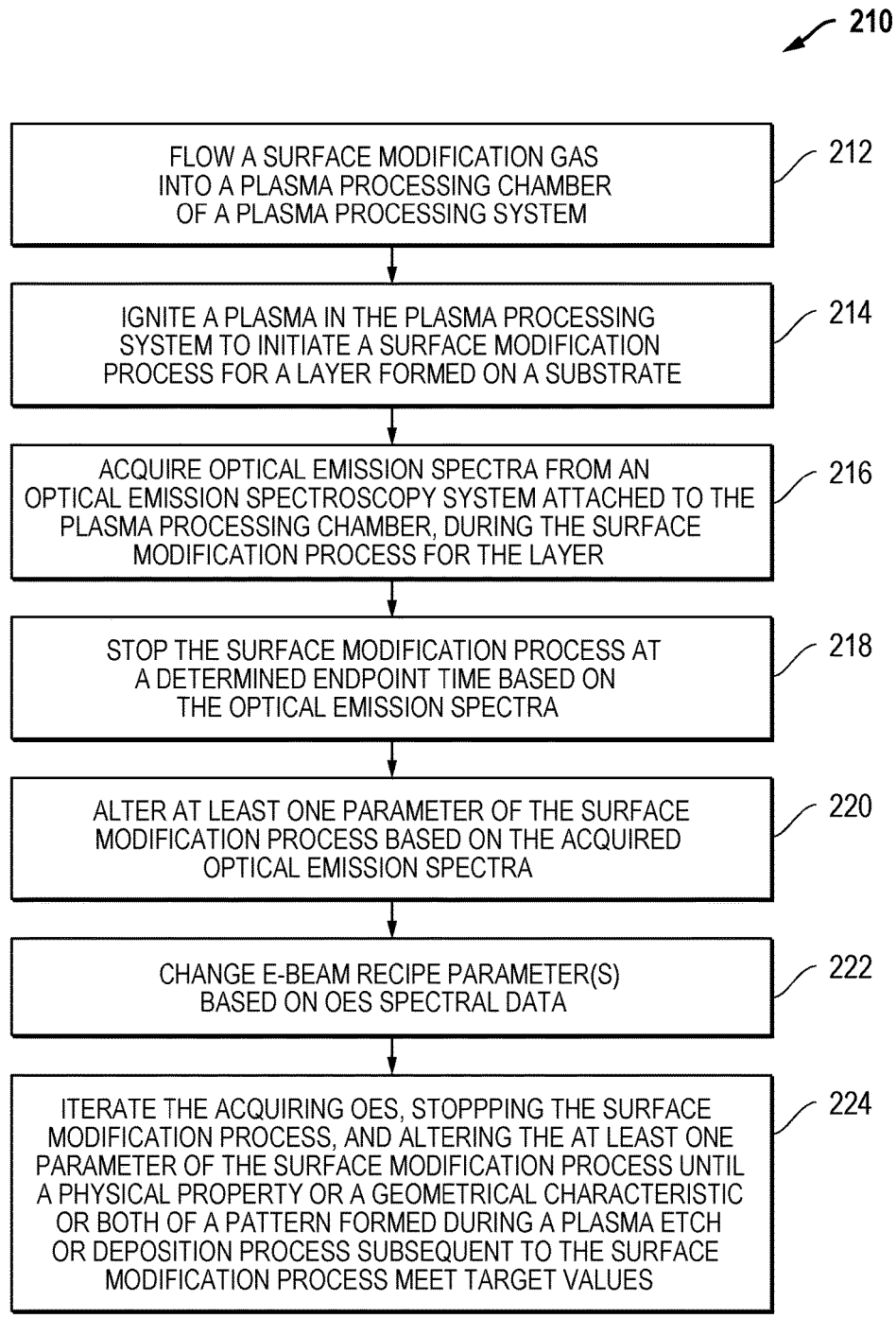
FIG. 2D is a block diagram of an example embodiment for a process where OES monitoring is used with respect to a surface modification process for a layer formed on a substrate.

FIG. 2D is a block diagram of an example embodiment 210 for a process where OES monitoring is used with respect to a surface modification process for a layer formed on a substrate. In block 212, a surface modification gas is flowed into a plasma processing chamber of a plasma processing system. In block 214, a plasma is ignited in the plasma processing system to initiate a surface modification process for a layer formed on a substrate. In block 216, optical emission spectra is acquired from an optical emission spectroscopy (OES) system attached to the plasma processing chamber, during the surface modification process for the layer. In block 218, the surface modification process is stopped at a determined endpoint time based on the optical emission spectra. In block 220, at least one parameter of the surface modification process is then altered based on the acquired optical emission spectra. In block 222, e-beam recipe parameter(s) are then changed based on OES spectral data. In block 224, an iteration then occurs for acquiring OES, stopping the surface modification process, and altering the at least one parameter of the surface modification process until a physical property or a geometrical characteristic or both of a pattern formed during a plasma etch or deposition process subsequent to the surface modification process meet target values.

Figure 2E:
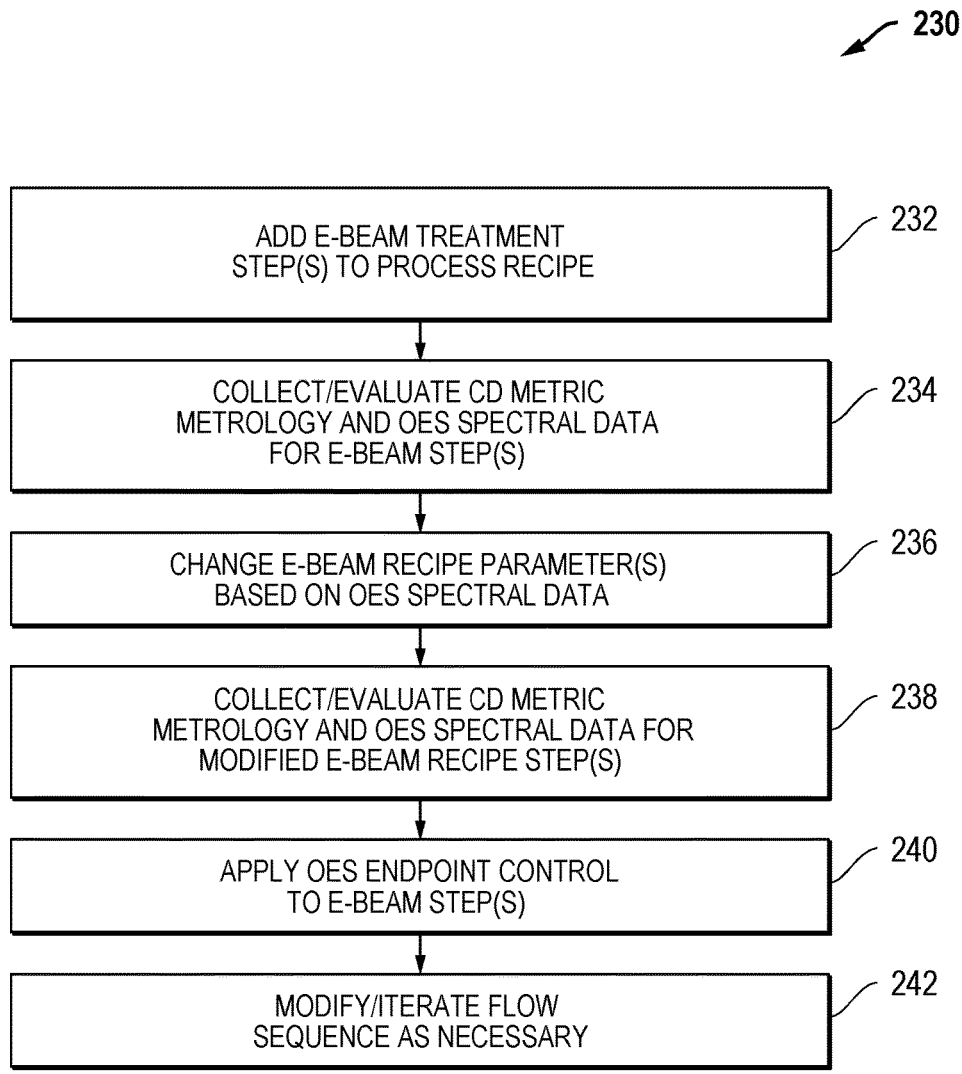
FIG. 2E is a block diagram of an example embodiment for a process where OES monitoring is used to monitor, modify, and/or control electron beam treatments.

FIG. 2E is a block diagram of an example embodiment 230 for a process here OES monitoring is used to monitor, modify, and/or control electron beam treatments. In block 232, one or more e-beam treatment step(s) are added to the process recipe. In block 234, CD metric metrology and OES spectral data is collected and/or evaluated for the e-beam step(s). In block 236, e-beam recipe parameter(s) are changed based on the OES spectral data. In block 238, CD metric metrology and OES spectral data is collected and/or evaluated for the modified e-beam recipe step(s). In block 240, OES endpoint control is applied to the e-beam step(s). In block 242, the flow sequence is modified and/or iterated as necessary.

Figure 3:
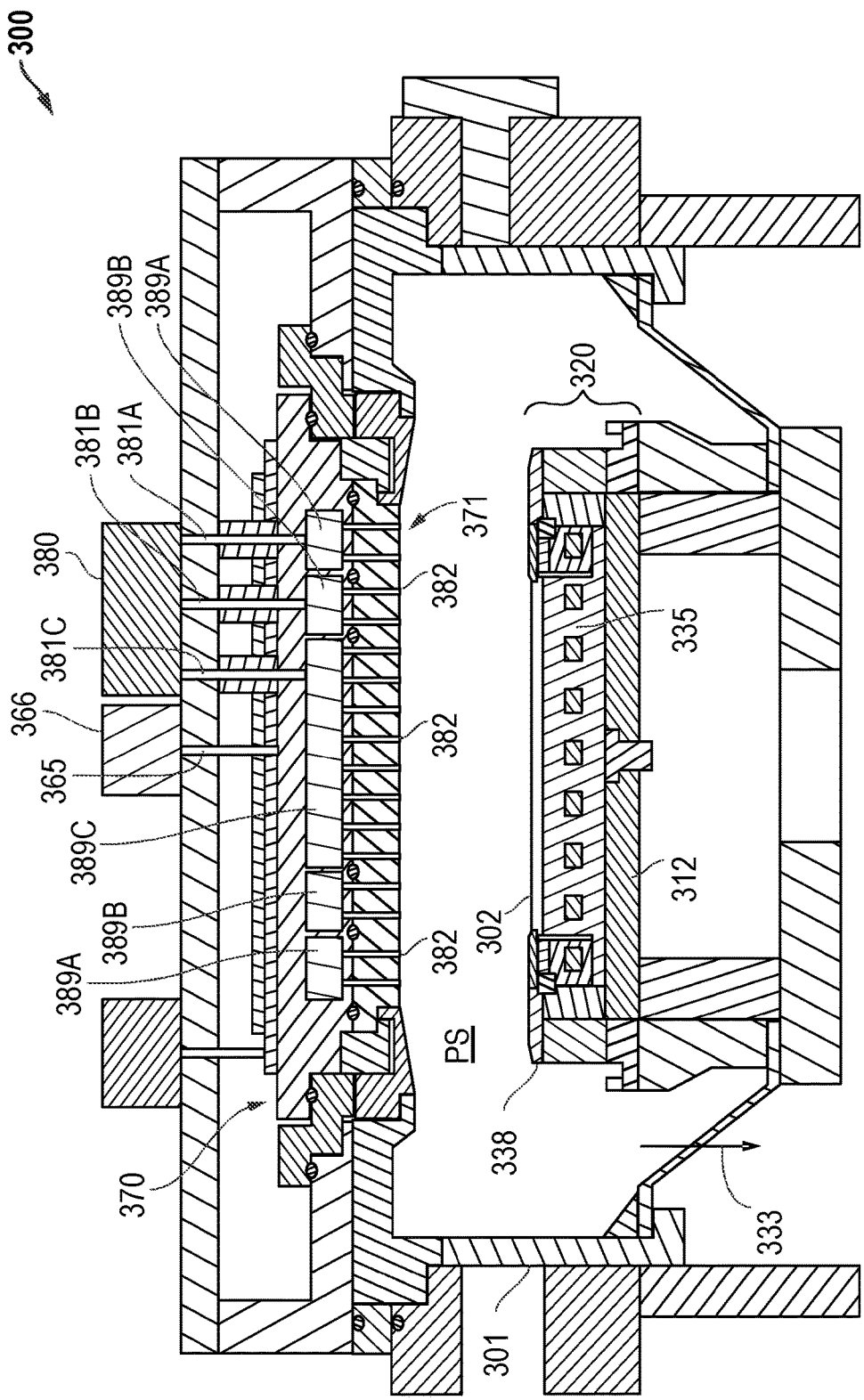
FIG. 3 is a diagram of an example embodiment for a workpiece manufacturing system, such as a plasma processing system, that can be used to implement the processing techniques described herein.

FIG. 3 is a diagram of an example embodiment 300 for a workpiece manufacturing system, such as a plasma processing apparatus, that can be used for the embodiments described herein. More particularly, FIG. 3 illustrates one example embodiment for a plasma processing apparatus merely for illustrative purposes that can be used to implement the processing techniques described herein. It will be recognized that other plasma process systems and other etch process systems may equally implement the techniques described herein. For the example embodiment 300 of FIG. 3, a schematic cross-sectional view is provided for a capacitively coupled plasma (CCP) processing apparatus including a process space (PS) that provides an etch chamber for microelectronic workpieces. Alternative plasma process apparatus may also be utilized, including for example, but not limited to, inductively coupled plasma processing apparatus, microwave plasma processing apparatus, and the like. A capacitively coupled plasma processing apparatus may be particularly well suited, as the electrode spacing of such apparatus allow beneficial control of gases to a localized region of the plasma space, thus providing localized plasma processing on the substrate. In addition, CCP chambers have the ability to create electrode biasing to generate high-density electron beam exposure of exposed materials on a substrate. However, non-CCP etch or deposition chambers with ultraviolet cure (UV) capability could also leverage the concept of OPTS endpoint control for the same applications noted herein.

The plasma processing apparatus 300 can be used for multiple operations including asking, etching, deposition, cleaning, plasma polymerization, plasma-enhanced chemical vapor deposition (PECVD), atomic layer deposition (ALD) and so forth. The structure of a plasma processing apparatus 300 is well-known, and the particular structure provided herein is merely exemplary. Plasma processing can be executed within processing chamber 301, which can be a vacuum chamber made of a metal such as aluminum or stainless steel. The processing chamber 301 defines a processing vessel providing a process space (PS) for plasma generation. An inner wall of the processing vessel can be coated with alumina, yttria, or another protectant. The processing vessel can be cylindrical in shape or have other geometric configurations.

At a lower, central area within the processing chamber 301, a susceptor 312 (which can be disc-shaped) can serve as a mounting table on which, for example, a substrate 302 to be processed (such as a semiconductor wafer) can be mounted. Substrate 302 can be moved into the processing chamber 301 through a loading/unloading port and gate valve. Susceptor 312 forms part of a lower electrode assembly 320 as an example of a second electrode acting as a mounting table for mounting substrate 302 thereon. The susceptor 312 can be formed of, e.g., an aluminum alloy. Susceptor 312 is provided thereon with an electrostatic chuck (as part of the lower electrode assembly) for holding the substrate 302. The electrostatic chuck is provided with an electrode 335. Electrode 335 is electrically connected to direct current (DC) power source, not shown. The electrostatic chuck attracts the substrate 302 thereto via an electrostatic force generated when DC voltage from the DC power source is applied to the electrode 335. The susceptor 312 can be electrically connected with a high-frequency power source via a matching unit. For other embodiments and processing chambers, two or more power sources can be used and connected to electrode 335 and/or other electrodes within the processing chambers. This high-frequency power source (a second power source) can output a high-frequency voltage in a range from, for example, 2 MHz to 20 MHz. Applying high frequency bias power causes ions, in plasma generated in the processing chamber 301, to be attracted to substrate 302. A focus ring assembly 338 is provided on an upper surface of the susceptor 312 to surround the electrostatic chuck.

An exhaust path 333 can be formed through one or more exhaust ports (not shown) which connect to a gas exhaust unit. The gas exhaust unit can include a vacuum pump such as a turbo molecular pump configured to pump out the plasma processing space within the processing chamber 301 to a desired vacuum condition. The gas exhaust unit evacuates the inside of the processing chamber 301 thereby depressurizing the inner pressure thereof down to the desired degree of vacuum.

An upper electrode assembly 370 is an example of a first electrode and is positioned vertically above the lower electrode assembly 320 to face the lower electrode assembly 320 in parallel. The plasma generation space or process space (PS) is defined between the lower electrode assembly 320 and the upper electrode assembly 370. The upper electrode assembly 370 includes an inner upper electrode 371, having a disk shape, and an outer upper electrode which may be annular and surrounding a periphery of the inner upper electrode 371. The inner upper electrode 371 also functions as a processing gas inlet for injecting a specific amount of processing gas into the process space (PS) above substrate 302 mounted on the lower electrode assembly 320. The upper electrode assembly 370 thereby forms a showerhead. More specifically, the inner upper electrode 371 includes gas injection openings 382.

The upper electrode assembly 370 may include one or more buffer chamber(s) 389A, 389B, and 389C. The buffer chambers are used for diffusing process gas and can define a disk-shaped space. Processing gas from a process gas supply system 380 supplies gas to the upper electrode assembly 370. The process gas supply system 380 can be configured to supply a processing gas for performing specific processes, such as film-forming, etching, and the like, on the substrate 302. The process gas supply system 380 is connected to gas supply lines 381A, 381B, and 381C forming a processing gas supply path. The gas supply lines are connected to the buffer chambers of the inner upper electrode 371. The processing gas can then move from the buffer chambers to the gas injection openings 382 at a lower surface thereof. A flow rate of processing gas introduced into the buffer chambers 389A-C can be adjusted by, e.g., by using a mass flow controller. Further, the processing gas introduced is discharged from the gas injection openings 382 of the electrode plate (showerhead electrode) to the process space (PS). The inner upper electrode 371 functions in part to provide a showerhead electrode assembly.

As shown in FIG. 3, three buffer chambers 389A, 389B, and 389C are provided corresponding to edge buffer chamber 389A, middle buffer chamber 389B, and center buffer chamber 389C. Similarly, gas supply lines 381A, 381B, and 381C may be configured as edge gas supply line 381A, middle gas supply line 381B and center gas supply line 381C. The buffer chambers are provided in a manner corresponding to different localized regions of the substrate in this case edge, middle and center. As will be discussed more below, these regions may correspond to specific process plasma process conditions for localized regions of the substrate 302. It will be recognized that the use of three localized regions is merely exemplary. Thus, the plasma processing apparatus may be configured to provided localize plasma process conditions on any number of regions of the substrate. It is further again noted that any of a variety of configurations may be utilized, and the techniques described herein are not limited to the manner in which the process gas supply system 380 is configured to split the gas flows to the various buffer chambers.

The upper electrode assembly 370 is electrically connected with a high-frequency power source (not shown) (first high-frequency power source) via a power feeder 365 and a matching unit 366. The high-frequency power source can output a high-frequency voltage having a frequency of 40 MHz (megahertz) or higher (e.g., 60 MHz), or can output a very high frequency (VHF) voltage having a frequency of 30-300 MHz. This power source can be referred to as the main power supply as compared to a bias power supply. It is noted for certain embodiments there is no power source for the upper electrodes, and two power sources are connected to the bottom electrode. Other variations could also be implemented.

Components of the plasma processing apparatus can be connected to, and controlled by, a control unit, which in turn can be connected to a corresponding memory storage unit and user interface (all not shown). Various plasma processing operations can be executed via the user interface, and various plasma processing recipes and operations can be stored in a storage unit. Accordingly, a given substrate can be processed within the plasma processing chamber with various microfabrication techniques. In operation, the plasma processing apparatus uses the upper and lower electrodes to generate a plasma in the process space (PS). This generated plasma can then be used for processing a target substrate (such as substrate 302 or any material to be processed) in various types of treatments such as plasma etching, chemical vapor deposition, treatment of semiconductor material, glass material and large panels such as thin-film solar cells, other photovoltaic cells, and organic/inorganic plates for flat panel displays, etc.

Looking now to FIGS. 4A-B, 5A-B, 6A-B, 7-8, 9A-B, and 10-11, example embodiments are provided that use OES monitoring of surface modification processes to improve metrics for patterned structures formed using subsequent etch and/or deposition processes. It is noted that the process recipes and patterned structures shown and described with respect to these embodiments are merely examples, and the disclosed OES monitoring techniques can be used for other pre- or post-treatment recipe steps and patterned structures. It is further noted that additional and/or different processes and features can also be implemented while still taking advantage of the techniques described herein.

FIGS. 4A-B provide example recipe embodiments for example back-end-of-line (BEOL) trench process modifications based upon a POR. All recipes except for the first recipe use a resist e-beam cure surface modification or pre-treatment step. As described herein, the e-beam exposure is used to facilitate the curing or hardening of a resist layer that has been formed on the surface of a substrate for a microelectronic workpiece.

Looking first to FIG. 4A, recipe 402, labeled as recipe A-1, includes no e-beam cure modification step for the resist. Recipe 404, labeled as recipe A-2, includes a high voltage e-beam cure modification of the resist for 20 seconds. This cure time was reduced by 10 seconds for recipe 406, labeled as recipe A-4, and resulted in less photoresist loss, less CD widening, and lower resulting LWR.

Looking to FIG. 4B, additional recipes 408 and 410, labeled as recipe A-5 and A-6, respectively, were then implemented as follow-up resist cure recipes with recipe A-4 as a base. For recipe 408, labeled as recipe A-5, the resist cure time was reduced to 5 seconds. For recipe 410, labeled as recipe A-6, the resist cure time was also reduced to 5 seconds, and the DCS voltage was also reduced which resulted in further lessening of resist loss and lower resulting MR. In addition, center and edge (C/E) electrode temperatures were set 2. Centigrade (C) higher for higher temperature stability above 10 C operational guideline limits.

Figure 5A:
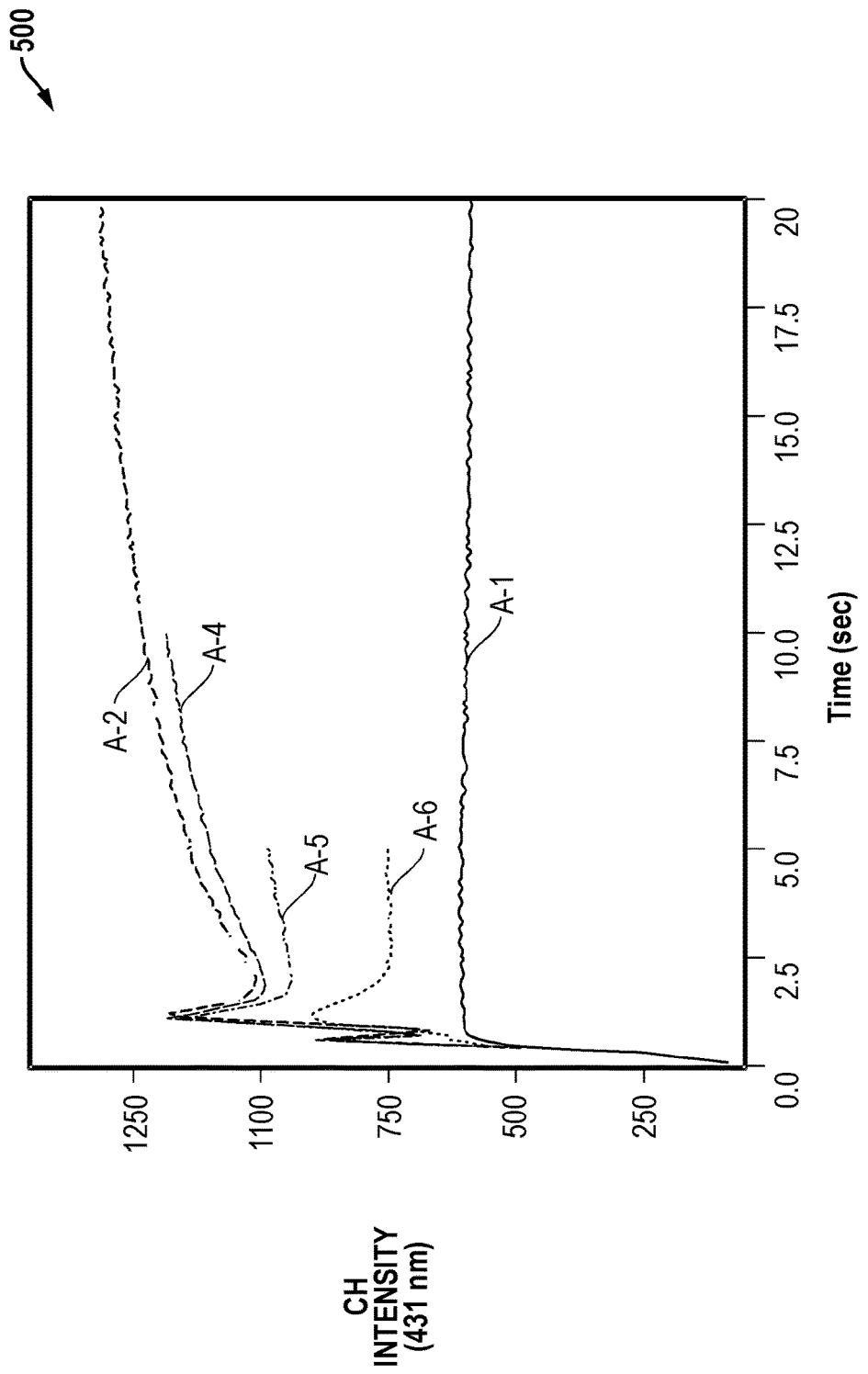
FIG. 5A is diagram for an example embodiment for OES spectral intensity levels measured for carbon-hydrogen (CH) molecular compounds, detected at a wavelength of 431 nanometers (nm), during the resist cure steps of the recipes shown in FIGS. 4A-B.

FIG. 5A is plot for an example embodiment 500 for OES spectral intensity levels measured for carbon-hydrogen (CH) molecular compounds, detected at a wavelength of 431 nm, during the resist cure step of recipes shown in FIGS. 4A-B. The CH intensities for the five recipes (A-1, A-2, A-4, A-5, A-6) over the course of the cure step are shown. It was found in other testing that depending on the resist type, too high of an e-beam exposure energy or plasma power can actually consume or shrink and roughen a resist surface leading to a wider CD for patterned structures post-etch. With respect to recipe A-2, the 900 volt (V) upper electrode voltage applied for this recipe generated the highest maximum peak intensity, associated with the resist surface phase transformation, initially before the 2 second mark as well as the highest CH slope increase after the 2 second mark. The recipe A-1 uses a 0V upper electrode voltage for e-beam treatment step as a baseline for comparison, which does not show an initial spike in CH intensity since the resist surface was essentially unchanged due to the lack of high-density electron exposure combined with the reactive gas. For recipe A-6, the flatter CH intensity at 700V was found to be associated with favorable CH crosslinking leading to resist smoothening, lower LWR, and smaller CD/less resist loss, without resist consumption or surface degradation analogous to 0V baseline recipe A-1. The CH intensity monitoring in OES was found to be the most critical wavelength since this photoresist, as many in general, was primarily composed of CH molecules. This e-beam treatment modified the CH cross-linking at the surface of the resist improving its subsequent dry etch resistance, leading to enhanced etch metrics including profile shape across the wafer.

Figure 5B:
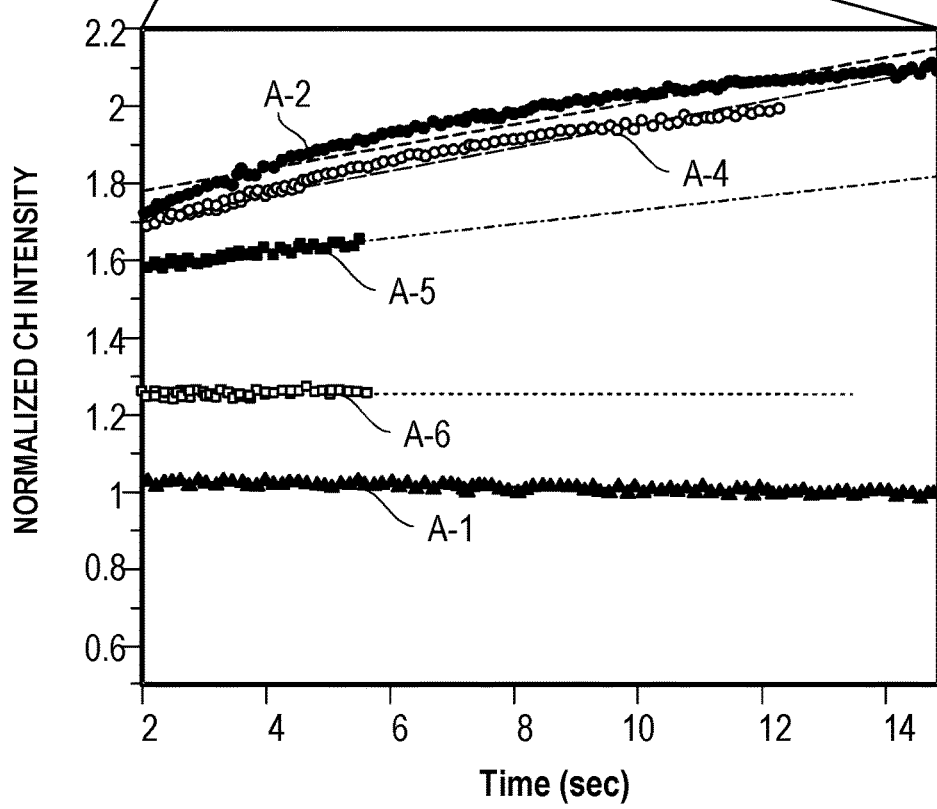
FIG. 5B is a diagram for an example embodiment for the slope of the normalized CH OES peak spectral intensities after the 2 sec portion of specific resist cure step conditions associated with FIG. 5A compared to resulting etch metrics such as: bottom etch profile CD, line width roughness (LWR), sidewall angle (SWA), and trench-depth uniformity (TDU).

FIG. 5B is a diagram for an example embodiment for the slope of the normalized CH OES peak spectral intensities during portions of specific resist cure step conditions associated with FIG. 5A compared to resulting etch metrics such as: bottom etch profile CI), line width roughness (LWR), sidewall angle (SWA), and trench-depth uniformity (TDU). A best-fit equation and slope for the plot is displayed in the corresponding table. It was found that a higher degree of positive slope or increase in OES spectra CH intensity associated with increased resist loss, leads to a larger bottom CD post-etch, lower SWA (rounded top profile), rougher modified resist surface layer and thereby higher LWR, and higher trench depth non-uniformity (over 5-10 s cure interval).

Figure 6A:
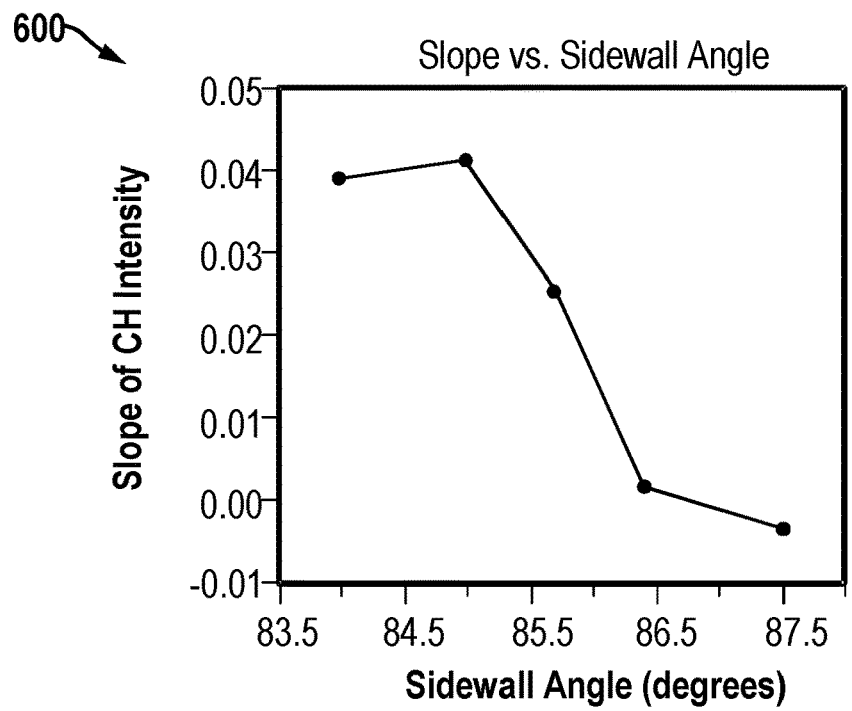
FIGS. 6A-B provide plots of the slope of normalized. CH OES spectral intensity after the 2 second (sec) portion of specific resist cure step conditions versus SWA and Bottom CD.
Figure 6B:
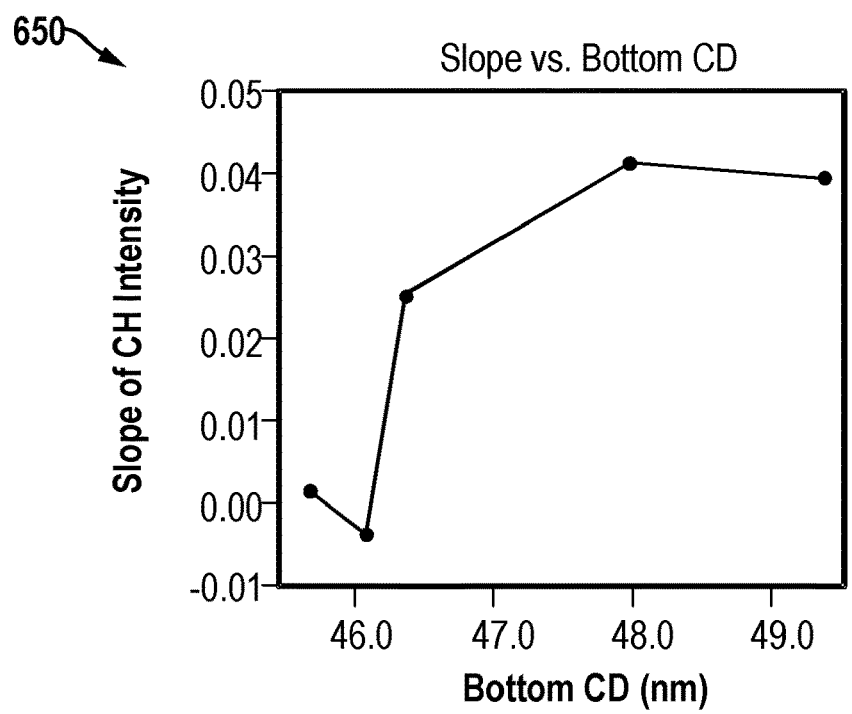

FIGS. 6A-B provide plots of the slope of normalized CH OES spectral intensity during the resist cure step versus SWA and Bottom CD. FIG. 6A shows a plot of an example embodiment 600 for the slope versus SWA. FIG. 613 provides a plot of an example embodiment 650 for slope versus bottom CD. It was found that a lower CH intensity increase in OES signal intensity over the resist cure leads to less resist consumption and retention of incoming resist CD width pre-hardmask etch and a higher SWA associated with less rounding of the resist profile due to the cure step that increases etch resistance; namely etch selectivity.

FIG. 7 is a plot for an example embodiment for OES spectral intensity levels measured for silicon-fluoride (SiF) bonded molecular compounds, detected as a resist cure treatment by-product in the chamber, at a wavelength of 440 nm, during the resist cure step conditions shown in FIGS. 4A-B. The SiF spectral intensities for the five recipes (A-1, A-2, A-4, A-5, A-6) are shown. Once again, as for the CH intensity plot, the recipe A-1 with a 0V upper electrode voltage for the pre-treatment step, used as a baseline for comparison, did not show an initial spike in SiF intensity, since the resist surface was essentially unchanged due to the lack of high-density electron exposure combined with the reactive gas. It was found that recipes A-2 and A-4 led to a higher LWR and wider CD due to resist loss. During the cure step for these recipes, OES detected a relatively high SiF maximum peak intensity over the initial 2 seconds and a positive slope in intensity after 2 seconds. It was also found that the relatively flat signal intensity for recipes A-5, and A-6, after the initial spike from 0-2 sec, led to lower LWR, less CD widening, less resist loss, and straighter etch profiles.

FIG. 8 is a diagram for an example embodiment 800 for the slope of the normalized SiF OES peak spectral intensities during portions of specific resist cure step conditions associated with FIG. 7 compared to resulting etch metrics such as: bottom etch profile CD, LWR, SWA, and TDU. A best-fit equation and slope are listed in the table associated with the plot. It was found that higher positive slope or increase in OES spectra SiF intensity was associated with increased resist loss leading to larger bottom CD post-etch, lower SWA, rougher modified resist surface layer and thereby higher LWR, and higher trench depth non-uniformity (over 5-10 s cure interval). Moreover, SiF happens to also be a common wavelength used in OES endpoint control for dry etching one layer to the next. In general, it was expected that the SiF slope correlation with various etch metrics would not be a perfect correlation, but typically multiple wavelengths in OES are utilized for determining etch endpoint times, and SiF is often used because it is a common by-product during a wide array of dry etch processes.

Figure 9A:
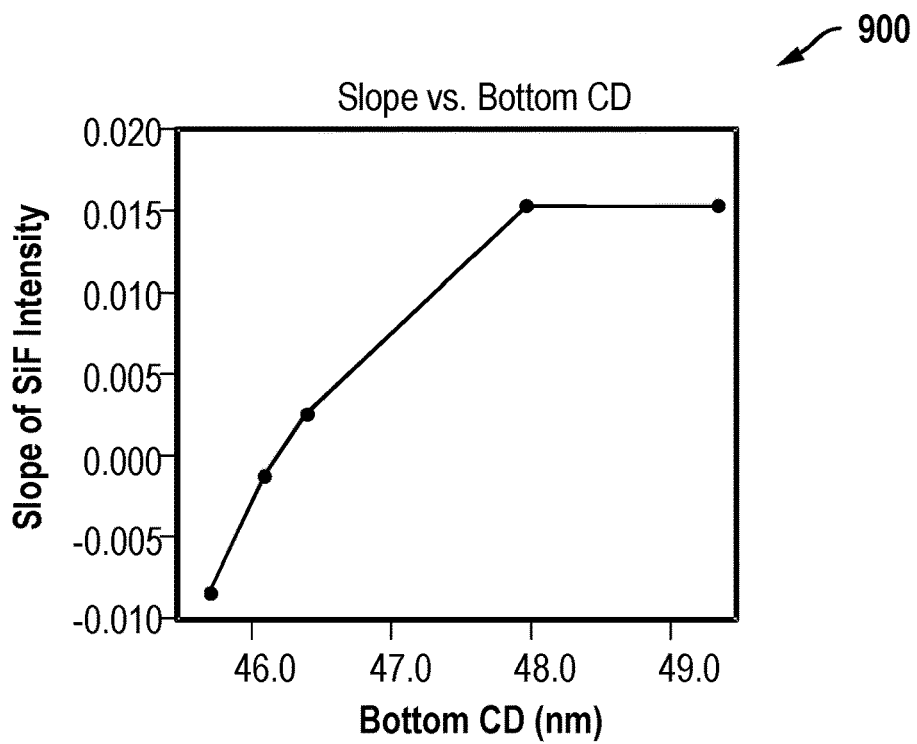
Figure 9B:
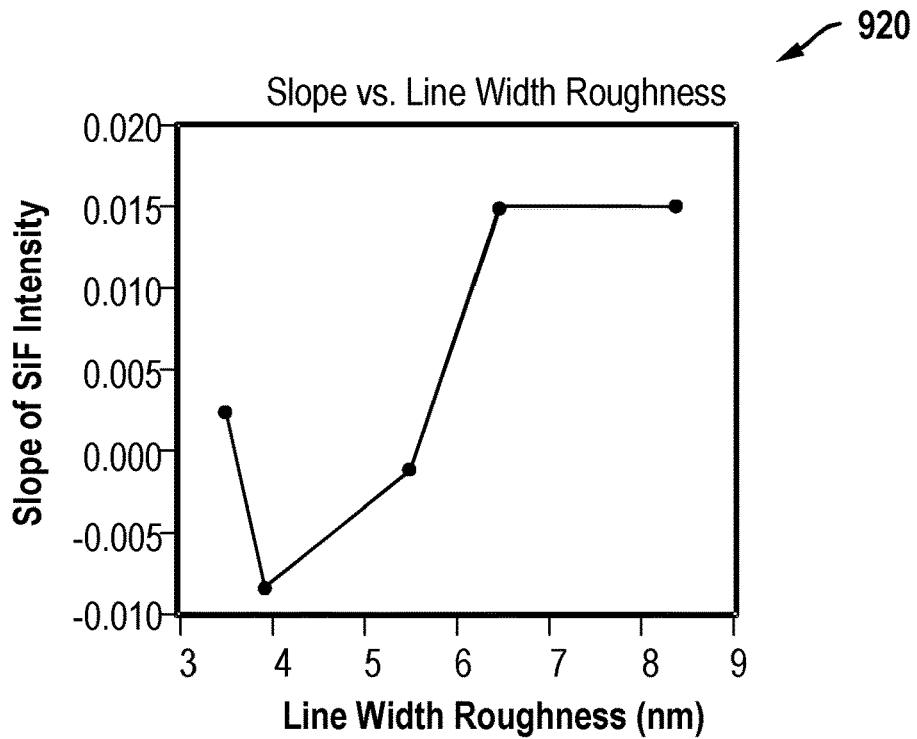
Figure 9C:
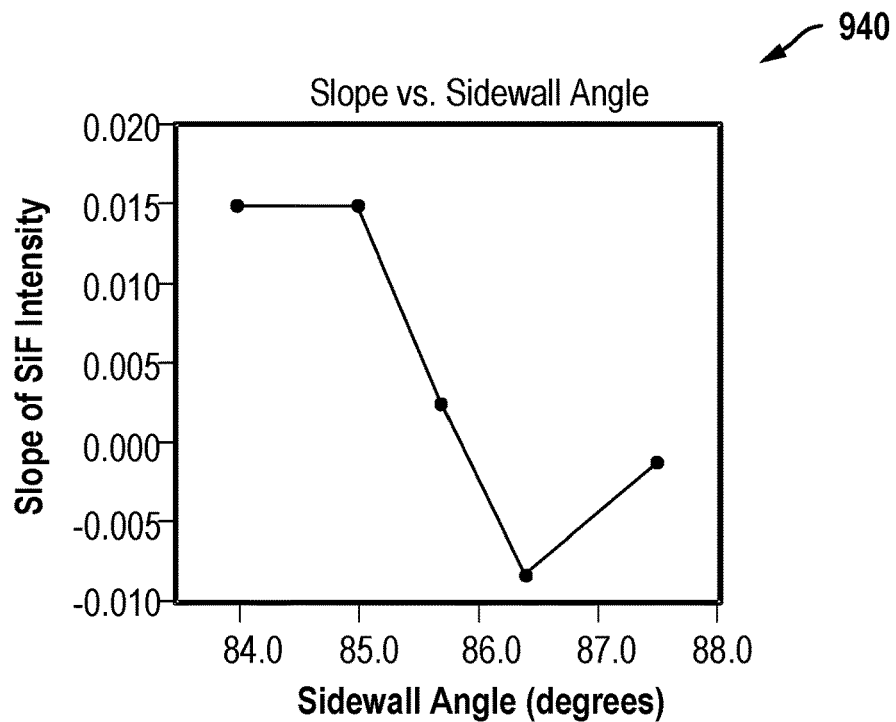
Figure 9D:
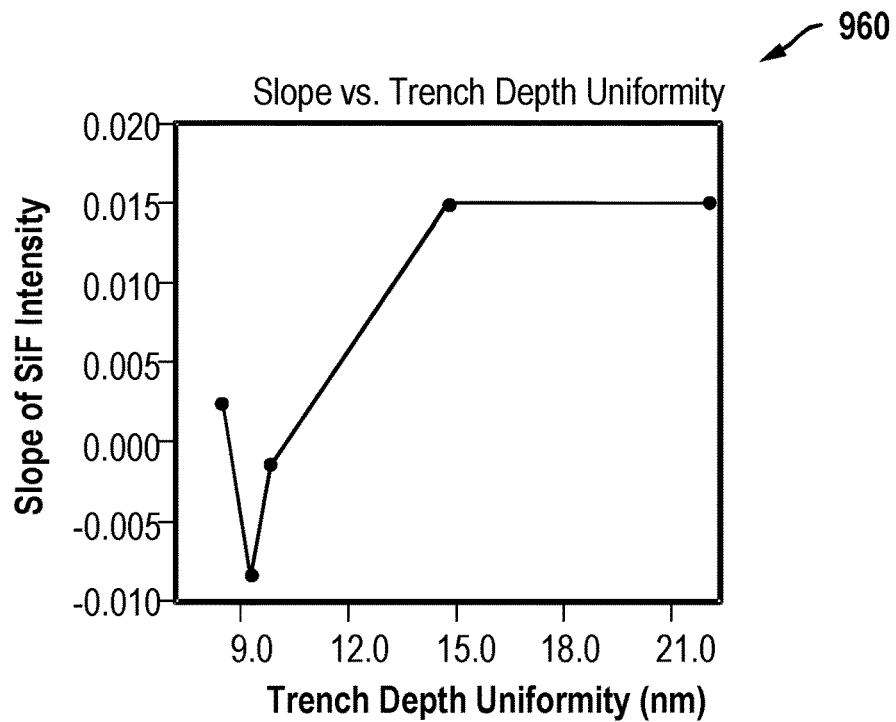

FIGS. 9A-D provide diagrams for slopes of normalized SiF spectral intensities during various resist cure step conditions versus resulting etch metrics. FIG. 9A is a plot for an example embodiment 900 for the slope versus bottom CD. FIG. 9B is a plot for an example embodiment 920 for slope versus LWR. FIG. 9C shows a plot for an example embodiment 940 for slope versus sidewall angle. FIG. 9D shows a plot for an example embodiment 960 for slope versus trench depth uniformity. It was found that a lower SiF intensity increase over the resist cure leads to less resist consumption and retention of incoming resist CD pre-etch and higher SWA with less rounding of resist profile, better TDU, and smoother resist surface with lower LWR. Out of all the etch metrics examined, the bottom CD was the strongest correlating factor to the slope of both the CH and SiF OES intensities for an array of cure conditions for this resist type. Thus, this technique is very sensitive to monitoring the key by-products evolving from the resist associated with consumption and/or shrinkage.

In addition to CH intensities and SiF intensities, OES spectra intensities were also investigated for fluorine (F), oxygen (O), carbon-oxygen (CO), and carbon-nitrogen (CN) molecular compounds. As indicated above, CH and SiF have OES spectral peaks at 431 nm and 440 nm, respectively. Fluorine has an OES spectral peak at 751 nm. Oxygen has an OES peak at 777 nm. CO has an OES peak at 662 nm. Molecules of CN have an OES peak at 387 nm. Other elements and compounds can also be monitored using OES spectral detection. For example, for one embodiment, the OES spectra or OES data associated with spectral lines includes a spectral line corresponding to a chemical element or compound selected from a group comprising N, Ar, Br, CH, C, CN, O, SiF, SiN, CO, and F in addition to metals associated with nanocrystalline hard-masks or resists such as Zr or Ti.

FIG. 10 provides an example table 1000 including a summary of OES maximum peak intensities versus resist cure conditions. Parameters for e-beam cure conditions of recipes A-1, A-2, A-4, A-5, and A-6 as described above, are listed with respect to FIGS. 4A-B. It was found that recipe A-6 provided an optimal overall resist cure condition for all etch metrics and had the strongest correlation to OES maximum peak intensities for SiF and CH during the initial phase of the resist cure step where DCS voltage was applied.

FIG. 11 provides an example table 1100 including a summary for the resist cure parameters and associated etch metrics corresponding to the recipes described with respect to 4A-B. It was found that different OES signal responses were clearly obtained during resist cure step for recipes with more ideal etch metrics versus recipes indicative of resist consumption having higher roughness and wider CDs post-etch. The OES monitoring of the treatment step uncovered the diagnostics associated with the real-time e-beam curing including trends associated with by-products evolving from the resist. By identifying ideal OES signatures during the cure step, the after clean inspection (ACI) target specifications could be met and/or be improved further for the resulting dry etch, as measured by scatterometry-based metrology, CD-SEM and cross-sectional SEM (X-SEM) thereafter. In addition, the implementation of OES endpoints enables multi-chamber matching for surface modification performance to improve consistency and cycle time of a production line.

It is further noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic workpiece" as used herein generically refers to the object being processed in accordance with the invention. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or un-patterned, but rather, is contemplated to include any such layer or base structure, and any combination of layers and/or base structures. The description below may reference various types of substrates, but this is for illustrative purposes only and not limitation.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, silicon carbide, diamond, gallium arsenide, gallium nitride, and indium phosphide. The substrate may be doped or un-doped.

Systems and methods for processing a microelectronic workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method for monitoring and controlling a process of plasma-assisted surface modification of a layer formed on a substrate, the method comprising:
   flowing a surface modification gas into a plasma processing chamber of a plasma processing system;
   igniting a plasma in the plasma processing chamber to initiate a surface modification process, which includes a photoresist hardening step, for a photoresist layer formed on a substrate;
   acquiring optical emission spectra from an optical emission spectroscopy system attached to the plasma processing chamber, during the surface modification process for the photoresist layer;
   altering at least one parameter of an electron beam-based exposure recipe based on the acquired optical emission spectra, the electron beam-based exposure recipe being applied to the photoresist hardening step; and
   repeating the photoresist hardening step with the altered electron beam-based exposure recipe on the photoresist layer formed on the substrate.

2. The method of claim 1, wherein the plasma processing system is a plasma etching system, and wherein the surface modification process occurs before or after one or more etch processes.

3. The method of claim 1, wherein the plasma processing system is a plasma system with deposition and/or etch capability, and wherein the modification process occurs before or after one or more etch or deposition processes.

4. The method of claim 1, wherein data from the acquired optical emission spectra is used to determine an endpoint of the surface modification process.

5. The method of claim 4, further comprising stopping the surface modification process at a determined endpoint time based on the optical emission spectra.

6. The method of claim 1, wherein data from the acquired optical emission spectra comprises an intensity of a spectral line, a slope of a spectral line, or both.

7. The method of claim 6, wherein the spectral line is a spectral line corresponding to a chemical element or compound selected from a group consisting of N, Ar, Br, CH, C, CN, O, SiF, SiN, CO, Ti, Zr and F.

8. The method of claim 6, wherein the spectral line is a spectral line corresponding to a chemical element or compound comprising one or more of N, Ar, Br, CH, C, CN, O, SiF, SiN, CO, Ti, Zr and F.

9. The method of claim 1, further comprising altering at least one parameter of the surface modification process based on the acquired optical emission spectra.

10. The method of claim 9, wherein the at least one parameter of the surface modification process is selected from a group consisting of RF or microwave power supplied to a plasma processing chamber, RF or microwave power pulse frequency, RF or microwave pulse duty cycle, substrate temperature, RF power supplied to a substrate holder in the plasma processing chamber, DC bias of the substrate holder, DC bias voltage supplied to at least one electrode arranged proximate the substrate holder, gas flow rate, gas pressure, surface modification gas flow, surface modification gas pressure, and duration of the surface modification process.

11. The method of claim 9, wherein the at least one parameter of the surface modification process comprises one or more of RF or microwave power supplied to a plasma processing chamber, RF or microwave power pulse frequency, RF or microwave pulse duty cycle, substrate temperature, RF power supplied to a substrate holder in the plasma processing chamber, DC bias of the substrate holder, DC bias voltage supplied to at least one electrode arranged proximate the substrate holder, gas flow rate, gas pressure, surface modification gas flow, surface modification gas pressure, and duration of the surface modification process.

12. The method of claim 9, wherein the altering of the at least one parameter of the surface modification process is performed to minimize a duration of the surface modification process.

13. The method of claim 9, wherein the altering of the at least one parameter of the surface modification process is performed to improve a physical property or a geometrical characteristic or both of a pattern formed during a plasma etch or deposition process subsequent to the surface modification process.

14. The method of claim 13, wherein the physical property comprises at least one of density or wet etch resistance, and wherein the geometrical characteristic comprises at least one of line width roughness (LWR) or line-edge roughness (LER).

15. The method of claim 9, wherein the altering of the at least one parameter of the surface modification process is performed to maximize a uniformity metric of a pattern formed during an etch or deposition process subsequent to the surface modification process.

16. The method of claim 15, wherein the uniformity metric is selected from a group consisting of critical dimension (CD) uniformity, sidewall angle (SWA) uniformity, and trench depth uniformity (TDU).

17. The method of claim 15, wherein the uniformity metric comprises one or more of critical dimension (CD) uniformity, sidewall angle (SWA) uniformity, and trench depth uniformity (TDU).

18. The method of claim 9, wherein the altering of the at least one parameter of the surface modification process is performed to maximize a uniformity metric of a pattern formed during an etch process of a subsequently processed production substrate or a subsequently processed lot of production substrates.

19. The method of claim 9, wherein the altering of the at least one parameter of the surface modification process is performed to alter a physical, geometrical, electrical, chemical, or mechanical property of a material exposed to a surface modification process.

20. The method of claim 19, wherein the property is selected from a group consisting of etch width critical dimension (CD), bow, tilting, twisting, etch selectivity, sidewall angle (SWA), etch depth, surface coverage, step coverage, layer thickness, layer density, layer composition, layer smoothness, and layer hardness.

21. The method of claim 19, wherein the property comprises one or more of etch width critical dimension (CD), bow, tilting, twisting, etch selectivity, sidewall angle (SWA), etch depth, surface coverage, step coverage, layer thickness, layer density, layer composition, layer smoothness, and layer hardness.

22. The method of claim 9, wherein the altering of the at least one parameter of the surface modification process is performed to alter a physical, geometrical, electrical, or mechanical property of a layer in a subsequently processed production substrate or a subsequently processed lot of production substrates.

23. The method of claim 9, wherein the altering of the at least one parameter of the surface modification process is performed in-situ.

24. The method of claim 1, wherein the surface modification gas comprises hydrogen, hydrogen-bromide, nitrogen, carbon, chlorine, fluorine, sulfur, argon, helium, oxygen or a combination of two or more thereof.

25. The method of claim 1, wherein the layer formed on the substrate comprises a material selected from a group consisting of photoresist, spin-on-dielectric material, atomic or chemical vapor deposited dielectric material, low-k dielectric material, hi-k dielectric material, conductive material or a combination of two or more thereof.

26. The method of claim 1, wherein the layer formed on the substrate comprises a material comprising one or more of photoresist, spin-on-dielectric material, atomic or chemical vapor deposited dielectric material, low-k dielectric material, hi-k dielectric material, conductive material or a combination of two or more thereof.

27. The method of claim 1, wherein the layer formed on the substrate comprises a chemically amplified resist (CAR), and further comprising altering at least one parameter of the surface modification process based on the acquired optical emission spectra to reduce likelihood of pattern collapse for the CAR.

28. The method of claim 27, wherein the CAR comprises an ArF-based dry or immersion resist.

29. The method of claim 1, wherein the layer formed on the substrate comprises a resist utilized in conjunction with extreme ultra-violet (EUV) photolithography.

30. The method of claim 29, wherein the EUV resist comprises a material selected from a group consisting of a metallic hardmask (MHM) layer, a nanocrystalline metal oxide MHM layer, and a MHM stack including a combination of these layers.

31. The method of claim 29, wherein the EUV resist comprises a material comprising one or more of a metallic hardmask (MHM) layer, a nanocrystalline metal oxide MHM layer, and a MHM stack including a combination of these layers.

32. The method of claim 1, wherein the electron beam-based exposure recipe comprises applying a direct current (DC) superposition voltage to an electrode within the plasma processing chamber.

33. The method of claim 1, wherein the e-beam voltage or energy and exposure time is increased such that a bulk of the layer is modified for the layer.

34. The method of claim 1, wherein the surface modification process comprises at least one of a surface hardening step, a curing of the layer formed on the substrate, or a de-scum step for residue removal.

35. A method for monitoring and controlling a surface modification process in a plasma processing tool, the method comprising:
- flowing a surface modification gas into a plasma processing chamber of a plasma processing system;
- igniting a plasma in the plasma processing chamber to initiate surface modification process, which includes a photoresist hardening step, for a photoresist layer formed on a substrate;
- monitoring the plasma in the plasma processing chamber during the surface modification process for the photoresist layer using a monitoring system;
- altering at least one parameter of an electron beam-based exposure recipe based on the monitored plasma, the electron beam-based exposure recipe being applied to the photoresist hardening step; and
- repeating the photoresist hardening step with the altered electron beam-based exposure recipe on the photoresist layer formed on the substrate,
- wherein the monitoring system comprises at least one of an optical emission spectroscopy, a laser induced fluorescence, a laser interferometry, laser spectroscopy, a mass spectrometry, a Raman spectroscopy, a residual gas analyzer (RGA), or a Fourier Transform Infrared (FTIR) system.

* * * * *

UNITED STATES PATENT AND TRADEMARK OFFICE
CERTIFICATE OF CORRECTION

PATENT NO. : 10,446,453 B2
APPLICATION NO. : 15/920295
DATED : October 15, 2019
INVENTOR(S) : Brian J. Coppa et al.

It is certified that error appears in the above-identified patent and that said Letters Patent is hereby corrected as shown below:

In the Specification

In Column 2, Line 51, delete "UES" and insert -- OES --, therefor.

In Column 6, Line 7 (approx.), delete "features, it" and insert -- features. It --, therefor.

In Column 6, Line 16 (approx.), delete "(UES)" and insert -- (OES) --, therefor.

In Column 6, Line 62, delete "normalized." and insert -- normalized --, therefor.

In Column 7, Line 8, delete "CI)," and insert -- CD, --, therefor.

In Column 8, Line 62, delete "system);" and insert -- system), --, therefor.

In Column 9, Line 15, delete "UES" and insert -- OES --, therefor.

In Column 9, Line 33, delete "EN" and insert -- EUV --, therefor.

In Column 9, Line 42, delete "MI-IM" and insert -- MHM --, therefor.

In Column 9, Line 62, delete "and or" and insert -- and/or --, therefor.

In Column 11, Line 21, delete "here" and insert -- where --, therefor.

In Column 11, Line 59, delete "OPTS" and insert -- OES --, therefor.

In Column 11, Line 62, delete "asking," and insert -- ashing, --, therefor.

In Column 14, Line 38, delete "MR." and insert -- LWR. --, therefor.

Signed and Sealed this
Fifth Day of May, 2020

Andrei Iancu
*Director of the United States Patent and Trademark Office*

CERTIFICATE OF CORRECTION (continued)
U.S. Pat. No. 10,446,453 B2

In Column 14, Line 39, delete "2." and insert -- 2 --, therefor.

In Column 15, Line 9, delete "CI)," and insert -- CD, --, therefor.

In Column 15, Line 22, delete "613" and insert -- 6B --, therefor.

In Column 16, Line 52, delete "4A-B." and insert -- FIGS. 4A-B. --, therefor.